US011946962B2

(12) United States Patent
Li et al.

(10) Patent No.: US 11,946,962 B2
(45) Date of Patent: Apr. 2, 2024

(54) SYSTEM, DEVICE, METHOD, AND PROGRAM FOR ANALYSIS

(71) Applicant: TOYO Corporation, Tokyo (JP)

(72) Inventors: Congbing Li, Tokyo (JP); Kazu Kitagawa, Tokyo (JP); Nozomu Miura, Tokyo (JP); Tetsuya Nakamura, Tokyo (JP); Naoki Azuma, Tokyo (JP)

(73) Assignee: TOYO Corporation, Tokyo (JP)

( * ) Notice: Subject to any disclaimer, the term of this patent is extended or adjusted under 35 U.S.C. 154(b) by 245 days.

(21) Appl. No.: 17/552,564

(22) Filed: Dec. 16, 2021

(65) Prior Publication Data

US 2022/0252646 A1 Aug. 11, 2022

Related U.S. Application Data

(63) Continuation of application No. PCT/JP2021/004681, filed on Feb. 8, 2021.

(51) Int. Cl.
G01R 23/00 (2006.01)
G01R 23/16 (2006.01)
G06F 40/279 (2020.01)

(52) U.S. Cl.
CPC ........... G01R 23/16 (2013.01); G06F 40/279 (2020.01); *G06F 2218/12* (2023.01)

(58) Field of Classification Search
CPC ...... G01R 31/002; G01R 31/16; G06F 40/279
See application file for complete search history.

(56) References Cited

U.S. PATENT DOCUMENTS

| 11,340,602 | B2* | 5/2022 | Giering | G05B 23/0294 |
|---|---|---|---|---|
| 2008/0077337 | A1 | 3/2008 | Yoshinaga | |
| 2015/0293162 | A1 | 10/2015 | Tsukamoto et al. | |
| 2020/0235765 | A1* | 7/2020 | Azizi | G06N 3/08 |
| 2020/0235833 | A1* | 7/2020 | Zhu | H04B 1/1027 |

(Continued)

FOREIGN PATENT DOCUMENTS

| JP | S59-163570 A | 9/1984 |
|---|---|---|
| JP | 2005-189045 A | 7/2005 |
| JP | 2007-43554 A | 2/2007 |

(Continued)

OTHER PUBLICATIONS

International Search Report and Written Opinion of the International Searching Authority issued by the Japan Patent Office for corresponding International Patent Application No. PCT/JP2021/004681, dated Apr. 27, 2021.

*Primary Examiner* — Thang X Le

(74) *Attorney, Agent, or Firm* — Myers Wolin, LLC

(57) ABSTRACT

An analysis system includes inference processer circuitry configured to infer a corresponding classification by inputting part of frequency spectrum data corresponding to reference measurement data to a learned model having learned a relation between part of frequency spectrum data corresponding to sample measurement data and a classification related to noise corresponding to the part, causal component identification processer circuitry configured to identify causal component data of noise from a component data list based on the inferred classification, and a presentation information generator configured to generate presentation information for a user based on the causal component data.

16 Claims, 22 Drawing Sheets

(56) References Cited

U.S. PATENT DOCUMENTS

2020/0371148 A1* 11/2020 Scott ................... G01R 31/002
2022/0107348 A1* 4/2022 Suetsugu ........... G01R 29/0871

FOREIGN PATENT DOCUMENTS

| JP | 2014-174149 A | 9/2014 |
| JP | 6669939 B1 | 3/2020 |
| JP | 2020-94889 A | 6/2020 |
| WO | 2006/019196 A1 | 2/2006 |
| WO | 2014/065032 A1 | 5/2014 |
| WO | 2020/113260 A1 | 6/2020 |

* cited by examiner

FIG. 2

| FRE-QUENCY [MHz] | POLARI-ZATION | LEVEL QP [dB(μV/m)] | LEVEL PK [dB(μV/m)] | LEVEL AV [dB(μV/m)] | QP ALLOWABLE VALUE [dB(μV/m)] | PK ALLOWABLE VALUE [dB(μV/m)] | AV ALLOWABLE VALUE [dB(μV/m)] | MARGIN QP[dB] | MARGIN PK[dB] | MARGIN AV[dB] | HEIGHT [cm] | ANGLE [°] | REMARKS SUCH AS NOISE COUNTERMEASURES | MEASUREMENT START DATE AND TIME |
|---|---|---|---|---|---|---|---|---|---|---|---|---|---|---|
| 351.822 | H | 30.0 | 31.2 | 29.67 | 37.00 | 40.00 | 37.00 | 7.00 | 8.8 | 7.33 | 120 | 220 | APPLY A COUNTERMEASURE TO NOISE AT COMPONENT DEF WITH A CAPACITOR (50 pF) | 2 November 2020, 10:00 |
| 359.997 | H | 29.00 | 30.3 | 28.63 | 37.00 | 40.00 | 37.00 | 8.00 | 9.7 | 8.37 | 140 | 200 | APPLY A COUNTERMEASURE TO NOISE AT THE FLAT CABLE OF COMPONENT XYZ WITH A CORE | 2 November 2020, 10:00 |
| 375.139 | H | 45.09 | 46.1 | 44.31 | 37.00 | 40.00 | 37.00 | -8.09 | -6.1 | -7.31 | 160 | 180 | USE AN ELECTRIC WAVE ABSORBER FOR COMPONENT UVW | 2 November 2020, 10:00 |
| 52.341 | H | 52.6 | 54.03 | 49.7 | 37.00 | 40.00 | 37.00 | -15.60 | -15.7 | -12.7 | 180 | 160 | GROUND TO THE CASING THROUGH A CAPACITOR | 2 November 2020, 11:00 |
| 375.133 | H | 28.78 | 29.13 | 28.13 | 37.00 | 40.00 | 37.00 | 8.22 | 10.87 | 8.87 | 200 | 140 | GROUND METAL USED FOR COMPONENT UVW | 2 November 2020, 11:00 |
| 52.332 | H | 53.1 | 54.61 | 52.61 | 37.00 | 40.00 | 37.00 | -16.10 | -14.61 | -15.61 | 220 | 120 | SHIELD THE SUBSTRATE WITH A METAL CASE | 2 November 2020, 13:00 |
| 52.353 | H | 51.00 | 53.22 | 50.62 | 37.00 | 40.00 | 37.00 | -14.00 | -13.22 | -13.62 | 114.3 | 273.9 | USE A GASKET AT THE CONNECTION PART OF COMPONENT ABC | 2 November 2020, 14:00 |
| 52.351 | H | 31.00 | 31.98 | 30.78 | 37.00 | 40.00 | 37.00 | 6.00 | 8.02 | 6.22 | 240 | 100 | PREVENT NOISE AT THE OPENING PART OF COMPONENT ABC WITH A SHIELD | 2 November 2020, 15:00 |
| 52.255 | H | 29.00 | 30.72 | 28.02 | 37.00 | 40.00 | 37.00 | 8.00 | 9.28 | 8.98 | 100 | 235 | PREVENT NOISE AT THE OPENING PART OF COMPONENT ABC WITH A SHIELD | 13 November 2020, 16:00 |

FIG. 3

| COMPONENT | UVW | | | XYZ | | |
|---|---|---|---|---|---|---|
| MODULATION DEGREE (%) | 0.25 | | | 0.5 | | |
| MODULATION MODE | SSCGmin | CENTER | SSCGmax | SSCGmin | CENTER | SSCGmax |
| MAXIMUM FREQUENCY | | 800 | | | 720 | |
| MAXIMUM ORDER | | 30 | | | 10 | |
| 1 | 26.0447 | 26.1100 | 26.1753 | 69.6500 | 70.0000 | 70.3500 |
| 2 | 50.0895 | 52.2200 | 52.3506 | 139.3000 | 140.0000 | 140.7000 |
| 3 | 78.1342 | 78.3300 | 78.5258 | 208.9500 | 210.0000 | 211.0500 |
| 4 | 104.1789 | 104.4400 | 104.7011 | 278.6000 | 280.0000 | 281.4000 |
| 5 | 130.2236 | 130.5500 | 130.8764 | 348.2500 | 350.0000 | 351.7500 |
| 6 | 156.2684 | 156.6600 | 157.0517 | 417.9000 | 420.0000 | 422.1000 |
| ... | ... | ... | ... | ... | ... | ... |

FIG. 4

| CENTRAL FREQUENCY [MHz] | FREQUENCY (LOW) [MHz] | FREQUENCY (HIGH) [MHz] | POLARI-ZATION | LEVEL QP [dB(μV/m)] | LEVEL PK [dB(μV/m)] | LEVEL AV [dB(μV/m)] | QP ALLOWABLE VALUE [dB(μV/m)] | PK ALLOWABLE VALUE [dB(μV/m)] | AV ALLOWABLE VALUE [dB(μV/m)] | MARGIN QP[dB] | MARGIN PK[dB] | MARGIN AV[dB] | HEIGHT [cm] | ANGLE [°] | COM-PONENT |
|---|---|---|---|---|---|---|---|---|---|---|---|---|---|---|---|
| 366.000 | 349.9 | 381.9 | H | 30.01 | 34.91 | 26.01 | 37.00 | 40.00 | 35.00 | 6.99 | 5.09 | 8.99 | 254.3 | 135.0 | PQR |
| 375.137 | 357.8 | 392.7 | H | 28.78 | 32.17 | 24.55 | 37.00 | 40.00 | 35.00 | 8.22 | 7.83 | 10.45 | 141.13 | 298.3 | STU |
| ... | | | | ... | | | ... | | | ... | | | ... | ... | ... |

FIG. 11
EXEMPLARY NARROW
BAND NOISE
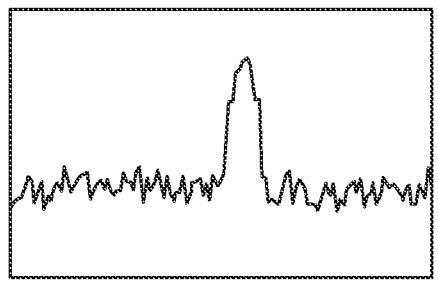
EXEMPLARY SPREAD
NARROW BAND NOISE
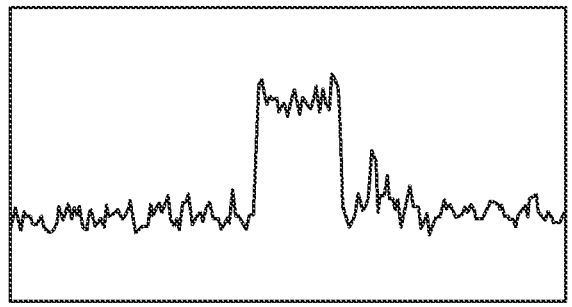
EXEMPLARY WIDE
BAND NOISE
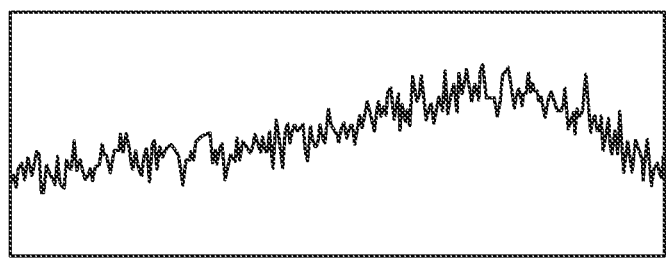

SYSTEM, DEVICE, METHOD, AND PROGRAM FOR ANALYSIS

CROSS-REFERENCE TO RELATED APPLICATION

This application is a continuation application of International Application PCT/JP2021/004681 filed on Feb. 8, 2021 and designated the U.S., the entire contents of which are incorporated herein by reference.

TECHNICAL FIELD

The present disclosure relates to the field of countermeasures for electromagnetic interference (EMI) of electronic devices and the like, and particularly relates to, for example, a device configured to support countermeasures for noise attributable to the electronic devices and the like.

BACKGROUND ART

Electromagnetic waves radiated from an electronic device or the like can be a cause of electromagnetic interference (EMI) that interferes functions of another electronic device or the like. Thus, countermeasures against electromagnetic noise (or interfering waves) attributable to electronic devices and the like are needed for normal operation of electronic devices and the like without malfunction nor failure.

Heretofore, workers engaged with such noise countermeasures observe a target waveform such as a frequency spectrum by using software (for example, Patent Literature 1) for analyzing measurement data, identify a noise part, estimate a noise cause based on experience and comparison with past data, and apply countermeasures in accordance with the cause.

CITATION LIST

Patent Literature

Patent Literature 1: Japanese Patent No. 6669939

SUMMARY

Technical Problem

However, recently, noise cause identification has been difficult due to, for example, densification of electronic devices and the like, which has led to increase in time and cost for countermeasures. Thus, the efficiency of noise cause identification work has been desired.

An object of the present disclosure, which has been made in view of the above-described technological background, is to provide a technology that enables a worker engaged with noise countermeasures to efficiently perform noise cause identification irrespective of proficiency and skills, and accordingly, reduce a load of noise cause identification work performed by the worker.

Other objects and effects of the present disclosure could be readily understood by the skilled person in the art by referring to the following description in the specification.

Solution to Problem

The above-described technical problem can be solved by an analysis system, an analysis device, an analysis method, and an analysis program having configurations described below.

Specifically, an analysis system according to the present disclosure includes: an inference processing unit configured to infer a corresponding classification by inputting part of frequency spectrum data corresponding to reference measurement data to a learned model having learned a relation between part of frequency spectrum data corresponding to sample measurement data and a classification related to noise corresponding to the part; a causal component identification unit configured to identify causal component data of noise from a component data list based on the inferred classification; and a presentation information generation unit configured to generate presentation information for a user based on the causal component data.

With this configuration, since the causal component data of noise is identified and presented from the component data list based on the inferred classification, it is possible to efficiently and accurately identify a causal component of noise. In other words, it is possible to reduce a load of noise cause identification work. Note that the sample measurement data includes, for example, past measurement data.

The part of frequency spectrum data may be a unique waveform part included in frequency spectrum data.

With this configuration, a classification can be inferred based on data of the unique waveform part as a noise candidate, and thus it is possible to perform efficient noise cause estimation.

The unique waveform part may be a peak waveform part included in frequency spectrum data.

With this configuration, a classification can be inferred based on data of the peak waveform part as a noise candidate, and thus it is possible to perform efficient noise cause estimation.

The classification may be a classification based on a typical waveform generated on a frequency spectrum by noise.

With this configuration, since the classification is performed based on a waveform typically generated on a frequency spectrum by noise, it is possible to identify a component acting as a generation cause of noise after roughly classifying the noise, and thus it is possible to more efficiently and accurately identify the component acting as the cause of the noise.

The typical waveform may include a narrow band waveform having a peak at one frequency, a spread narrow band waveform maintaining a relatively high level in a predetermined frequency range and having a peak near each of start and end points of the frequency range, and a wide band waveform corresponding to neither the narrow band waveform nor the spread narrow band waveform and maintaining a relatively high level in a predetermined frequency range.

With this configuration, it is possible to classify noise based on a waveform typically observed for electromagnetic noise attributable to a component of an electronic device or the like.

The spread narrow band waveform may be generated due to a spread spectrum clock generator.

With this configuration, it is possible to apply appropriate noise countermeasures to an electronic device or the like to which noise countermeasures are applied by a spread spectrum clock generator.

The causal component data may include countermeasure related information for corresponding noise.

With this configuration, it is possible to identify a causal component of noise as well as countermeasure related information of the noise.

The analysis system may further include a first database reference unit configured to acquire related information by referring to, based on a keyword included in the countermeasure related information, a countermeasure database including information related to noise countermeasures.

With this configuration, it is possible to comprehensively obtain information related to noise countermeasures and perform examinations upon multiple perspectives.

The countermeasure database may include book information and countermeasure report information.

With this configuration, it is possible to perform examinations upon multiple perspectives based on book information, past countermeasure report information, and the like.

The analysis system may further include a clustering processing unit configured to identify similar measurement data including frequency spectrum data similar to the part of frequency spectrum data corresponding to the reference measurement data by performing clustering processing on the part of frequency spectrum data corresponding to the reference measurement data together with all or part of the sample measurement data.

With this configuration, it is possible to refer to the similar measurement data and thus efficiently and accurately perform noise cause estimation. In addition, it is possible to perform the noise cause estimation upon more multiple perspectives together with the causal component data.

The clustering processing may be performed by using DBSCAN.

With this configuration, it is possible to identify similar data without explicitly specifying the number of clusters.

The analysis system may further include: a related measurement data identification unit configured to identify, based on the similar measurement data, related measurement data as measurement data that is related to the similar measurement data; and an effect determination unit configured to identify measurement data for which an indicator related to a noise reduction effect is favorable among the related measurement data.

With this configuration, it is possible to identify the measurement data for which a noise reduction effect is favorable among the related measurement data based on the similar measurement data.

The related measurement data may be measurement data that is measured in the same time period with the similar measurement data.

With this configuration, it is possible to check measurement data obtained in the same time period and accurately examine the measurement data for which an indicator related to a noise reduction effect is favorable among the measurement data obtained in the same time period.

The measurement data for which an indicator related to a noise reduction effect is favorable may include countermeasure related information for corresponding noise, and the analysis system may further include a second database reference unit configured to acquire related information by referring to a countermeasure database including information related to past noise countermeasures based on a keyword included in the countermeasure related information corresponding to the measurement data for which the indicator is favorable.

With this configuration, it is possible to further acquire the related information from the countermeasure related information included in the measurement data for which an indicator related to a noise reduction effect is favorable, and thus it is possible to examine effective countermeasures.

The countermeasure database may include book information and countermeasure report information.

With this configuration, it is possible to perform examinations upon multiple perspectives based on the book information, past countermeasure report information, and the like.

The analysis system may further include a content determination unit configured to determine whether the related information is positive information or negative information, and the presentation information generation unit may generate presentation information for a user related to positive information among the related information based on a result of the determination by the content determination unit.

With this configuration, only positive-content information among the related information is presented, and thus it is possible to efficiently and accurately apply noise countermeasures.

The present disclosure may be conceptualized as an analysis device. Specifically, the analysis device according to the present disclosure includes: an inference processing unit configured to infer a corresponding classification by inputting part of frequency spectrum data corresponding to reference measurement data to a learned model having learned a relation between part of frequency spectrum data corresponding to sample measurement data and a classification related to noise corresponding to the part; a causal component identification unit configured to identify causal component data of noise from a component data list based on the inferred classification; and a presentation information generation unit configured to generate presentation information for a user based on the causal component data.

The present disclosure may be conceptualized as an analysis method. Specifically, the analysis method according to the present disclosure includes: an inference processing step of inferring a corresponding classification by inputting part of frequency spectrum data corresponding to reference measurement data to a learned model having learned a relation between part of frequency spectrum data corresponding to sample measurement data and a classification related to noise corresponding to the part; a causal component identification step of identifying causal component data of noise from a component data list based on the inferred classification; and a presentation information generation step of generating presentation information for a user based on the causal component data.

The present disclosure may be conceptualized as an analysis program. Specifically, the analysis program according to the present disclosure includes: an inference processing step of inferring a corresponding classification by inputting part of frequency spectrum data corresponding to reference measurement data to a learned model having learned a relation between part of frequency spectrum data corresponding to sample measurement data and a classification related to noise corresponding to the part; a causal component identification step of identifying causal component data of noise from a component data list based on the inferred classification; and a presentation information generation step of generating presentation information for a user based on the causal component data.

Advantageous Effect

According to the present disclosure, it is possible to provide a device and the like that reduce a load of noise cause identification work.

BRIEF DESCRIPTION OF DRAWINGS

FIG. 2 is an exemplary measurement data.

FIG. 3 is an exemplary component data list.

FIG. 4 is an exemplary wide-band component data list.

FIG. 11 is an explanatory diagram related to noise classification.

DESCRIPTION OF EMBODIMENTS

Embodiments of an analysis system, an analysis device, an analysis method, and an analysis program according to the present disclosure will be described below in detail with reference to the accompanying drawings.

1. First Embodiment

A first embodiment will be described below with an example in which the present disclosure is applied to an analysis device 1 configured to analyze measurement data including unknown noise. Note that the analysis device 1 may be achieved as a dedicated device or may be achieved by executing an analysis program on a general-purpose information processing device such as a PC.

(1.1 Hardware Configuration)

Figure 1:
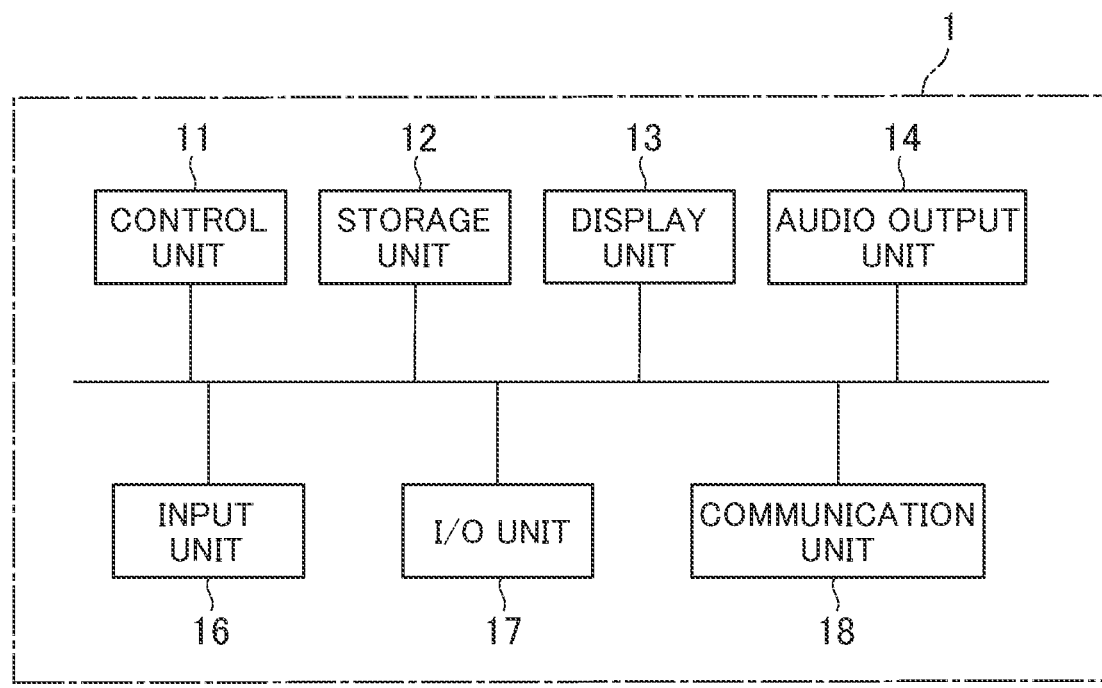
FIG. 1 is a hardware configuration diagram of an analysis device.

FIG. 1 is a hardware configuration diagram of the analysis device 1 according to the present embodiment. As understood from the drawing, the analysis device 1 according to the present embodiment includes a control unit 11, a storage unit 12, a display unit 13, an audio output unit 14, an input unit 16, an I/O unit 17, and a communication unit 18, and the units are connected to one another through a bus or the like.

The control unit 11 is a control device including a CPU, a GPU, and/or the like. The storage unit 12 is a storage device including a ROM, a RAM, a hard disk, a flash memory, or the like and stores various kinds of information to be described later, such as data and an operation program. The display unit 13 is connected to a display, which is not illustrated, or the like and performs display control of information presented to a user, for example, images.

The audio output unit 14 is connected to a speaker, which is not illustrated, or the like and performs audio output processing. The input unit 16 performs processing related to an input through a keyboard, a mouse, or the like connected to the analysis device 1. The I/O unit 17 is an interface for inputting to and outputting from an external device. The communication unit 18 is a communication unit compliant to a predetermined standard for performing wired or wireless communication.

Data stored in the storage unit 12 of the analysis device 1 will be described below with reference to FIGS. 2 to 5. Note that, in the present embodiment, all data is stored in the storage unit 12, however the present disclosure is not limited to such a configuration. Thus, for example, data may be stored in an external storage device, which is not illustrated, or the like. Furthermore, any data is exemplary, and other non-illustrated data with which operation to be described later is achieved is stored as well.

FIG. 2 is exemplary measurement data related to noise and stored in the storage unit 12. As understood from the drawing, the measurement data includes actual values as well as measurement metadata of a measurement environment and the like. Furthermore, the measurement data includes, for example, correct label information related to noise (narrow band noise, spread narrow band noise, and wide band noise), which will be described later.

In the example of the drawing, the measurement data includes a frequency (MHz), the state of polarization, a level QP (dB (μV/m)), a level PK (dB (μV/m)), a level AV (dB (μV/m)), a QP allowable value (dB (μV/m)), a PK allowable value (dB (μV/m)), an AV allowable value (dB (μV/m)), a margin QP (dB), a margin PK (dB), a margin AV (dB), a height (cm), an angle (°), remarks such as noise countermeasures, and measurement start date and time.

The frequency indicates the central frequency of measured noise. The state of polarization indicates the direction of an antenna: H represents the horizontal direction; and V represents the vertical direction. The level QP indicates a used detection scheme (quasi peak value detection) and a measured electric field intensity (level value). The level PK indicates a used detection scheme (peak value detection) and a measured electric field intensity (level value). The level AV indicates a used detection scheme (average value detection) and a measured electric field intensity (level value). The QP allowable value indicates an allowable level value on the frequency spectrum, which is determined by a standard in a case of quasi peak value detection. The PK allowable value indicates an allowable level value on the frequency spectrum, which is determined by a standard in a case of peak value detection. The AV allowable value indicates an allowable level value on the frequency spectrum, which is determined by a standard in a case of average value detection. Analysis can be performed upon multiple perspectives by comparing these three level values and three allowable level values.

The margin QP indicates the difference between the level QP and the QP allowable value in a case of quasi peak value detection. The margin PK indicates the difference between the level PK and the PK allowable value in a case of peak value detection. The margin AV indicates the difference between the level AV and the AV allowable value in a case of average value detection. The height and the angle indicate the height and angle of a measurement device at measurement, respectively.

The column of remarks such as noise countermeasures includes character information related to which countermeasure is applied to which component, such as "applied a countermeasure to noise at component DEF with a capacitor (50 pF)" and "used an electric wave absorber for component UVW", thereby allowing understanding of to which applied countermeasure and which component each measurement data corresponds. The measurement date and time store the start date and time of a measurement related to the measurement data.

Note that although not illustrated, the storage unit 12 also stores, for example, a measurement condition of measurement software having generated each measurement data. Furthermore, each measurement data includes data expressed in the frequency domain as well as data expressed in another format, such as data expressed in the time domain.

FIG. 3 is an exemplary component data list stored in the storage unit 12. In the drawing, two components named "UVW" and "XYZ" are indicated as examples. Each component data includes a modulation degree (%), a modulation mode, a maximum frequency, a maximum order, and an electric field intensity (level value) at each order.

The modulation degree indicates the degree of modulation. As described later, when narrow band noise without spreading is inferred, component data for which the modulation degree is 0% is referred. Furthermore, when spread narrow band noise that is narrow band noise with spreading is inferred, component data for which the modulation degree is larger than 0% is referred.

The modulation mode includes the items of "SSCGmin", "center", and "SSCGmax". SSCG stands for "spread spectrum clock generator", which functions to decrease a noise peak by spreading locally generated noise energy.

The "center" indicates the central frequency of a peak, the SSCGmin indicates the central frequency of a peak that appears near the start point of a predetermined frequency range in which a high level is maintained by spreading, and the SSCGmax indicates the central frequency of a peak that appears near the end point of the predetermined frequency range in which a high level is maintained by spreading.

The maximum order indicates the maximum value of a periodically appearing order, and the frequency is stored for each order in accordance with the modulation mode. Furthermore, the maximum frequency indicates the central frequency in a case of the maximum order.

FIG. 4 is an exemplary wide-band component data list stored in the storage unit 12. The wide-band component data list includes the central frequency, frequency (low), and frequency (high) of a peak, the kind of polarization, the level QP, the level PK, the level AV, the QP allowable value, the PK allowable value, the AV allowable value, the margin QP, the margin PK, the margin AV, the height, the angle, and information related to a component name. The frequency (low) indicates a start point frequency at which the noise level becomes higher than a predetermined threshold value, and the frequency (high) indicates an end point frequency at which the noise level is at or lower than the predetermined threshold value. The other items have meanings same as those in FIG. 2, and detailed description thereof is omitted. As described later, this list is referred when wide band noise is inferred.

Figure 5:
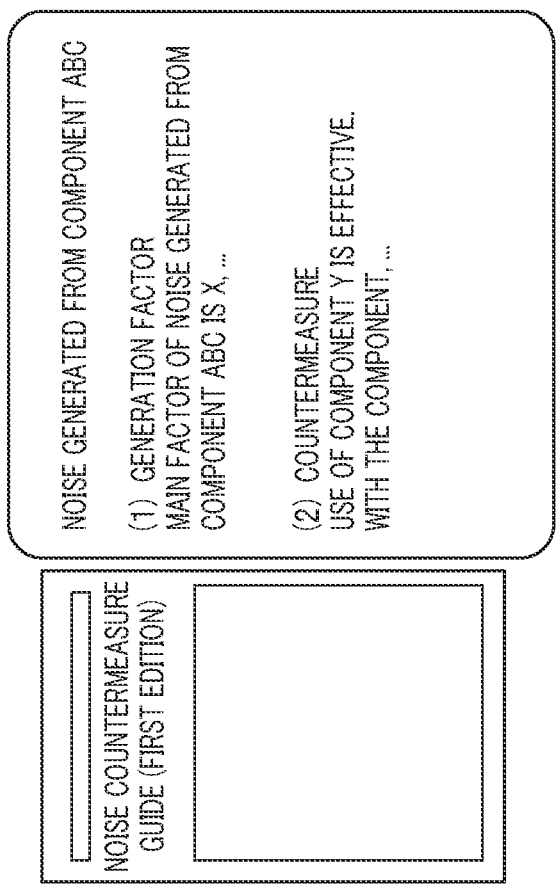
FIG. 5 is a conceptual diagram of a countermeasure knowledge base and information related to a past countermeasure report.

FIG. 5 is a conceptual diagram of information stored as a countermeasure database in the storage unit 12, in other words, a countermeasure knowledge base and information related to a past countermeasure report. The countermeasure knowledge base is digitized information of the contents of a related book such as a technological book, and stores information related to noise countermeasures for each component. For example, in the example of the drawing, information such as a generation cause of generated noise and a product used for a countermeasure is stored for each component. Furthermore, the information related to a countermeasure report is content information of a report related to countermeasures applied for noise in the past. The countermeasure report stores, for example, what event occurred when a "component ABC" is used in the past and what countermeasure applied for the event. These pieces of information are stored so that text search can be performed through each piece. Note that the format of data stored in a database may be any format. Furthermore, the contents of the data may include text only or may include images, etc.

Note that various kinds of data in addition to the data illustrated in FIGS. 2 to 5 is stored in the storage unit 12. For example, data such as a learned model (learning-completed model) to be described later, an operation program, and a frequency-domain or time-domain characteristic amount generated halfway through processing is stored. Furthermore, unknown measurement data as an analysis target is stored in the time-domain and frequency-domain expressions.

Figure 6:
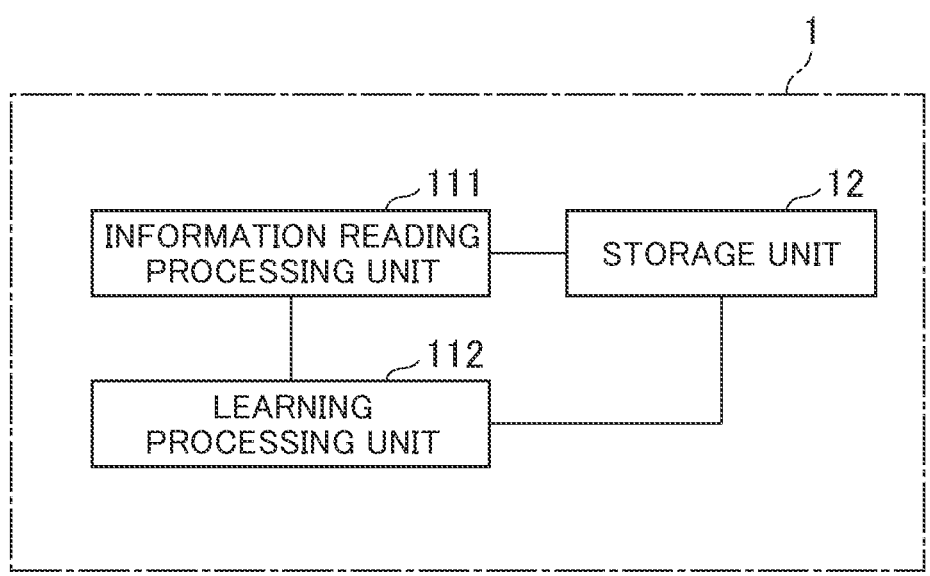
FIG. 6 is a functional block diagram of the analysis device.

FIG. 6 is a functional block diagram of the analysis device 1 when performing learning processing (S4) to be described later. As understood from the drawing, the analysis device 1 includes an information reading processing unit 111, the storage unit 12, and a learning processing unit 112.

The information reading processing unit 111 performs processing of reading information such as measurement data from the storage unit 12 and providing the read information to the learning processing unit 112. The learning processing unit 112 performs processing of reading a learned model, a learning condition parameter, and the like from the storage unit 12, performing learning processing on the measurement data, and storing a resulting learned model in the storage unit 12 again.

Figure 7:
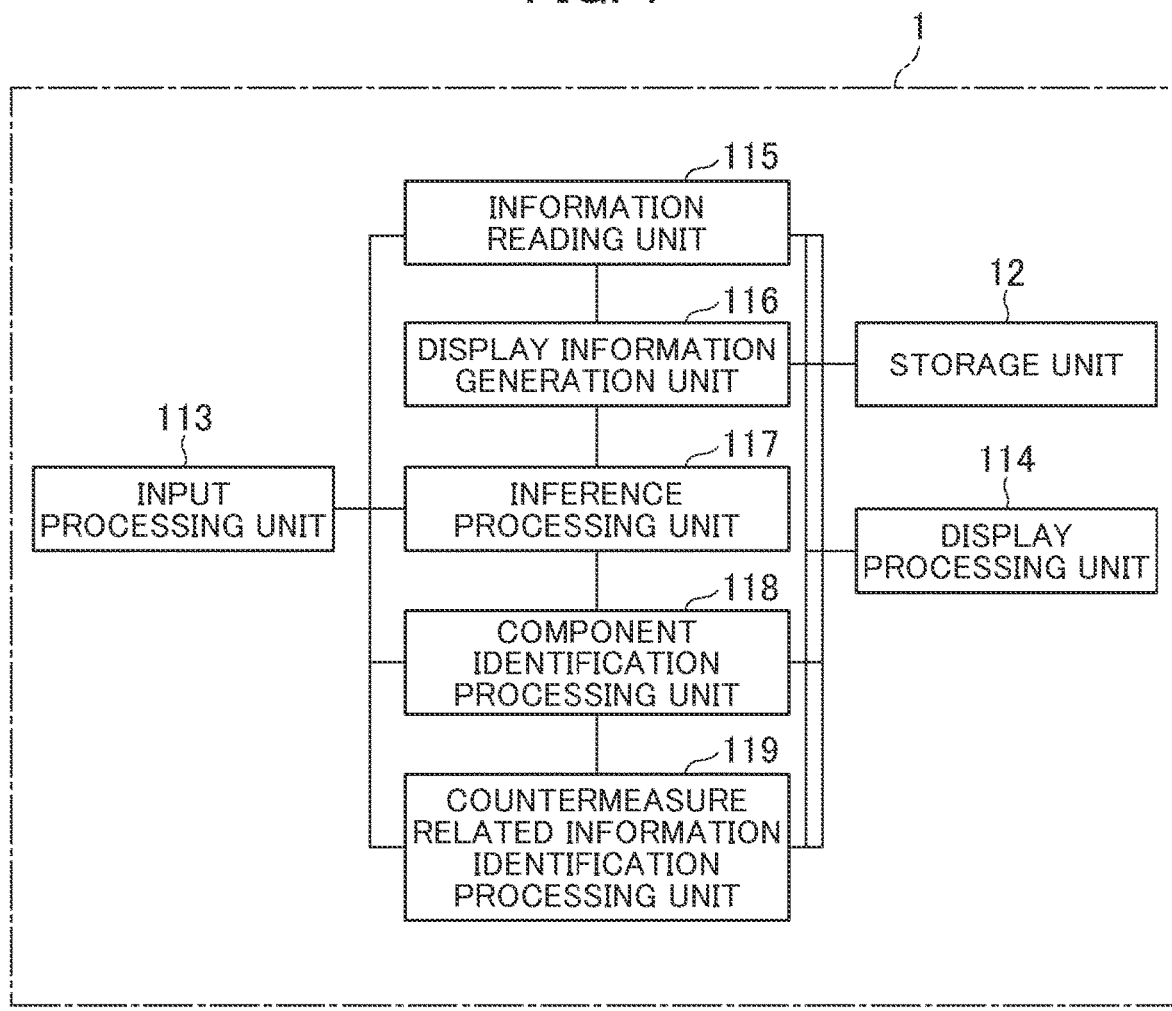
FIG. 7 is a functional block diagram of the analysis device when performing analysis processing.

FIG. 7 is a functional block diagram of the analysis device 1 when performing analysis processing (S5) to be described later. As understood from the drawing, the analysis device 1 includes an input processing unit 113, an information reading unit 115, a display information generation unit 116, an inference processing unit 117, a component identification processing unit 118, a countermeasure related information identification processing unit 119, the storage unit 12, and a display processing unit 114.

The input processing unit 113 receives an input from the user and transmits commands to the information reading unit 115, the inference processing unit 117, the component identification processing unit 118, and the countermeasure related information identification processing unit 119. The information reading unit 115 reads measurement data referred by the storage unit 12 and provides the read measurement data to the display information generation unit 116.

The display information generation unit 116 generates display information based on the read measurement data as appropriate and provides the generated display information to the display processing unit 114 and the inference processing unit 117. When a peak frequency is selected, the inference processing unit 117 identifies a noise classification corresponding to the peak frequency and provides the identified noise classification to the component identification processing unit.

The component identification processing unit 118 performs processing of identifying, based on the classification, a causal component having generated noise and provides a result of the identification to the display processing unit 114 and the countermeasure related information identification processing unit 119. The countermeasure related information identification processing unit identifies countermeasure related information based on data of the identified component and provides the identified countermeasure related information to the display processing unit 114.

The hardware configuration according to the present embodiment is described above but is not a limiting example. Thus, the hardware configuration may be modified in various manners and executed. For example, the analysis device 1 may be replaced with an analysis system 100 in a server-client form.

Figure 8:
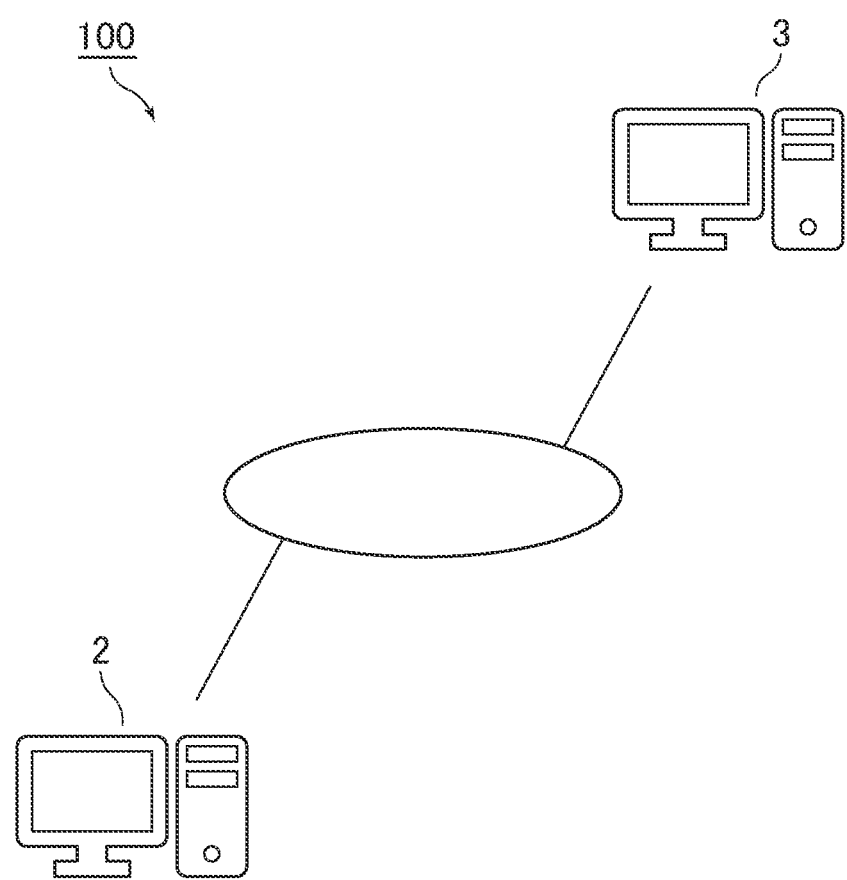
FIG. 8 is an entire configuration diagram of an analysis system.

FIG. 8 is an entire configuration diagram of the analysis system 100 in the server-client form. As understood from the drawing, a client device 2 that is an information processing device such as a PC is connected to a server device 3 that is an information processing device such as a PC through a network. The network may be a LAN (local area network) or the Internet.

In this example, the client device 2 transmits a command to the server device 3 based on an input from the user to the client device 2, and also receives and displays a result of processing at the server device 3. In addition, learning processing and analysis processing to be described later are performed at the server device 3.

Note that a server device may be additionally provided, and for example, a machine-learning server may be provided. In this case, the server device 3 can perform learning processing, inference processing based on a learned model, and the like by calling APIs as appropriate.

(1.2 Operation)

Subsequently, operation of the analysis device 1 will be described below. Note that the operation described below is achieved by executing an operation program stored in the storage unit 12.

Figure 9:
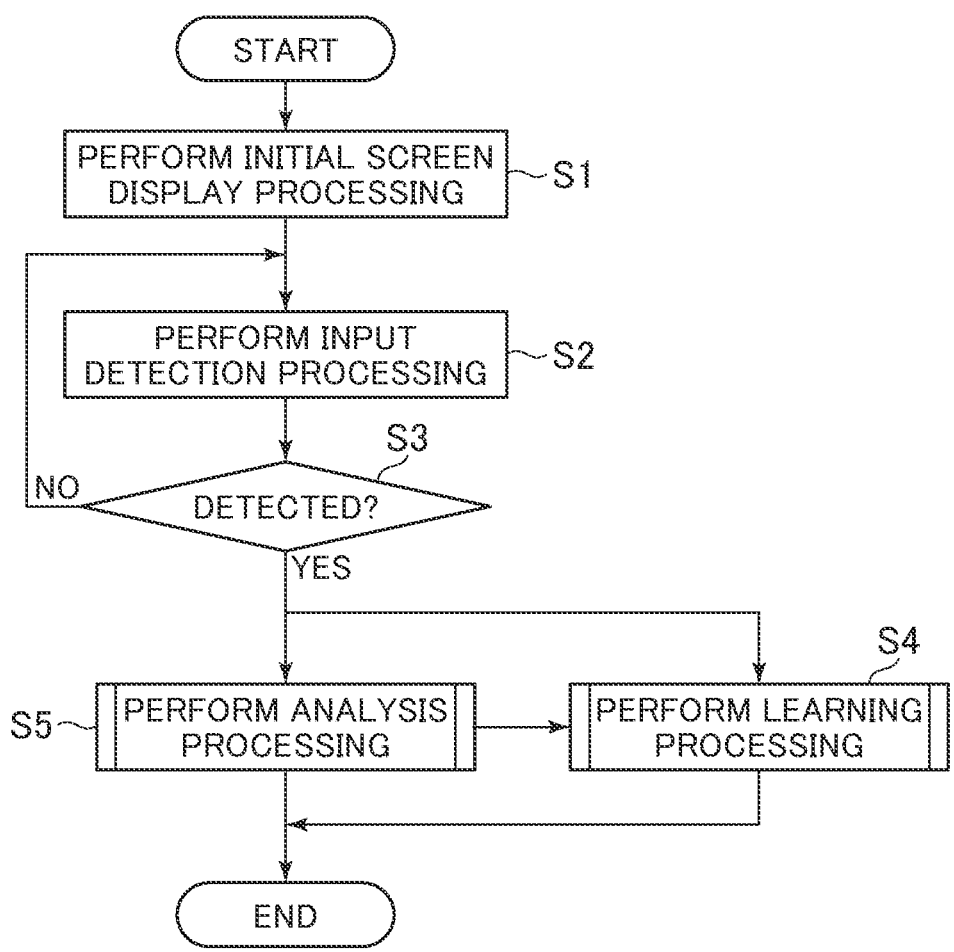
FIG. 9 is a general flowchart related to mode selection.

FIG. 9 is a general flowchart related to mode selection executed at the analysis device 1. As understood from the drawing, once processing is started, predetermined display processing (S1) is performed at the display unit 13. An initial screen is configured so that display related to "analysis processing" is selectable.

Thereafter, the analysis device 1 performs processing of detecting an input from the user through the input unit 16 (S2), and performs processing of detecting analysis processing selection (S3). The input detection processing is repeated (NO at S3) in an input waiting state until the detection is made.

In this state, when it is determined that "analysis processing" is selected (YES at S3), the analysis processing (S5) is executed. In addition, simultaneously with start of the analysis processing, "learning processing" is executed in parallel (S4). Note that although the learning processing is executed in the background in description of the present embodiment, an analysis mode related to the analysis processing and a learning mode related to the learning processing may be provided in a selectively executable manner.

(Learning Processing)

Figure 10:
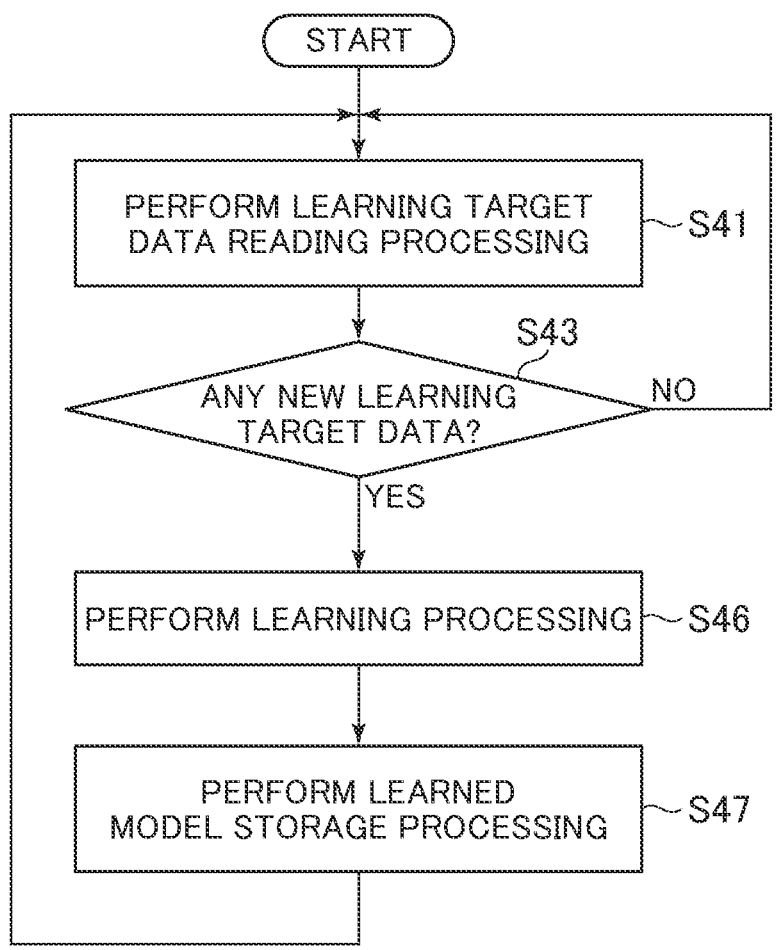
FIG. 10 is a detailed flowchart of learning processing.

FIG. 10 is a detailed flowchart of the learning processing (S4). As understood from the drawing, once the processing is started, the information reading processing unit 111 performs processing of reading measurement data stored in a specific region of the storage unit 12 (S41). Processing of determining whether measurement data as new learning target data exists is performed based on a result of the reading processing (S43). For example, the determination is made based on whether the measurement data is learned in the past. When it is determined that no measurement data as new learning target data exists (NO at S43), the reading processing is repeated again. As a result of the reading processing, when it is determined that new learning target data exists (YES at S43), the learning processing (S46) is performed based on measurement data as the new learning target data.

Note that although the present embodiment is described with a configuration in which measurement data is repeatedly read from the storage unit 12, the present disclosure is not limited to such a configuration. Thus, for example, the reading processing may be intermittently executed in a predetermined period, or the processing of reading new learning target data may be executed in accordance with a command from the user.

The learning processing unit 112 performs machine learning processing (S46) based on specified measurement data. More specifically, the learning processing unit 112 first performs processing of reading a learning processing operation program, a learning parameter, and the like. Thereafter, supervised learning of a neural network, in particular, a deep learning network using a predetermined label is performed for the read measurement data.

In the present embodiment, a level value (electric field intensity value) in the frequency domain of a predetermined width about each peak included in the frequency spectrum of the measurement data is input to the input layer of the neural network. The output layer thereof is provided with three nodes corresponding to noise classifications according to the present embodiment, and each node outputs a classification and a probability belonging to the classification. A teacher signal corresponds to the output layer and includes three labels annotated to each peak in advance.

FIG. 11 is an explanatory diagram related to noise classification according to the present embodiment. As understood from the drawing, in the present embodiment, noise is classified into the three kinds of narrow band noise, spread narrow band noise, and wide band noise, depending on a waveform typically generated on the measurement frequency spectrum by noise generated by an electronic device or the like.

An example of the narrow band noise is illustrated in the upper part of the drawing. As understood from the drawing, the narrow band noise has a frequency-spectrum waveform having a shape in which a high level is observed at one frequency point.

An example of the spread narrow band noise is illustrated in the middle part of the drawing. As understood from the drawing, the spread narrow band noise has a frequency-spectrum waveform maintaining a relatively high level in a predetermined frequency range and having a peak near each of the start and end points of the frequency range. Note that such a waveform is observed when a spread spectrum clock generator (SSCG) is used as an EMI countermeasure for the narrow band noise. The SSCG functions to prevent energy concentration to a particular frequency by varying the frequency of a clock signal, and accordingly, disperse locally generated noise energy.

An example of the spread noise is illustrated in the lower part of the drawing. As understood from the drawing, the spread noise has a frequency-spectrum waveform having a relatively high level value in a frequency range beyond one frequency point and is not classified into the narrow band noise nor the spread narrow band noise.

When learning processing is performed under the above-described conditions, it is possible to generate a learned model that outputs a probability belonging to each label upon inputting of a peak frequency on the frequency spectrum and level values about the frequency. With such a learned model, when an optional peak frequency and a level value in the frequency domain of a predetermined width about the peak frequency are input, it is possible to infer a classification to which noise related to this peak is likely to belong, for example, it is possible to infer that the noise is the narrow band noise at the probability of 5%, the spread narrow band noise at the probability of 93%, and the wide band noise at the probability of 2%.

Note that the method of the learning processing is not limited to that of the present embodiment. Thus, another learning model of a scheme other than a neural network may be used. Alternatively, semi-supervised learning or the like may be performed, for example, when the number of pieces of sample data is small.

Furthermore, although classification into the three kinds of the narrow band noise, the spread narrow band noise, and the spread noise is performed with focus on a typically observed noise shape in the present embodiment, the present disclosure is not limited to such a configuration. Thus, for example, classification may be performed into two kinds or four or more kinds, or may be performed from another viewpoint in accordance with noise properties and the like.

In addition, annotation related to a label may be visually and manually performed or may be performed by any other automatic method.

Returning to FIG. 10, when the learning processing is completed, the learning processing unit 112 performs processing (S47) of storing the generated learned model in the storage unit 12. Thereafter, the series of processing (S41 to S47) is repeated until a predetermined stop command is received.

(Measurement Data Analysis Processing)

Subsequently, the analysis processing (S5) of measurement data including unknown noise will be described below in detail.

Figure 12:
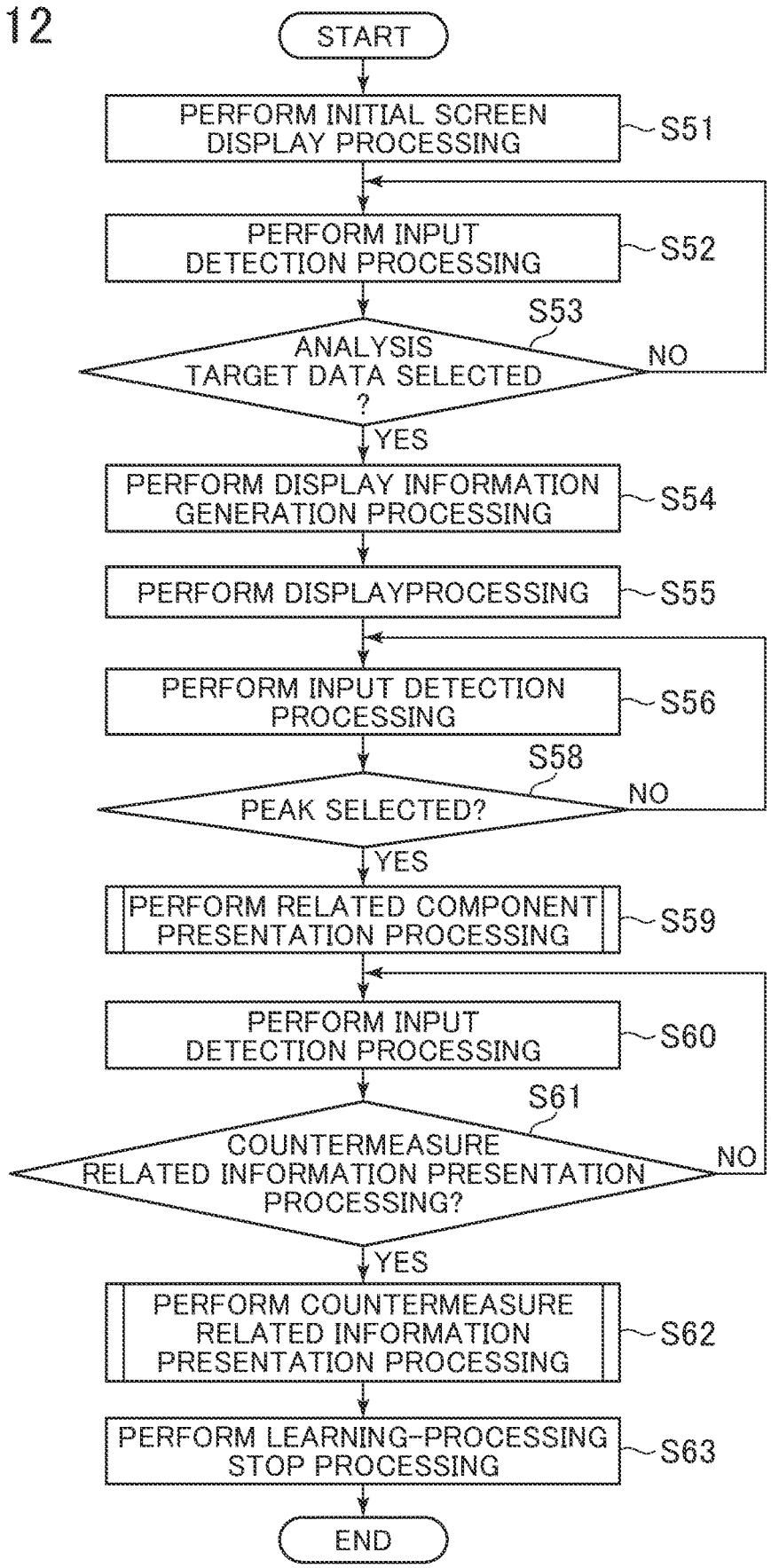
FIG. 12 is a detailed flowchart of analysis processing.

FIG. 12 is a detailed flowchart of the analysis processing (S5). As understood from the drawing, once the processing is started, the display processing unit 114 performs processing of displaying and presenting a predetermined initial screen to the user (S51). The initial screen is configured so that measurement data as an analysis target is selectable.

After the initial-screen display processing, the input processing unit 113 performs input detection processing (S52) and becomes an input waiting state until measurement data as an analysis target is selected (NO at S53). In this state, when an input indicating selection of particular measurement data is received from the user, the input processing unit 53 determines that measurement data as an analysis target is selected, and transmits, to the information reading unit 115, a command to read the selected measurement data (YES at S53).

Having received the command, the display information generation unit 116 reads the measurement data as an analysis target from the storage unit 12 and performs processing (S54) of generating display information. The display information generation processing is processing of generating information necessary for displaying a display screen to be described later, and includes, for example, processing of detecting a frequency-spectrum peak corresponding to the measurement data.

When display information is generated, the display processing unit 114 performs processing of displaying the generated display information (S55).

Figure 13:
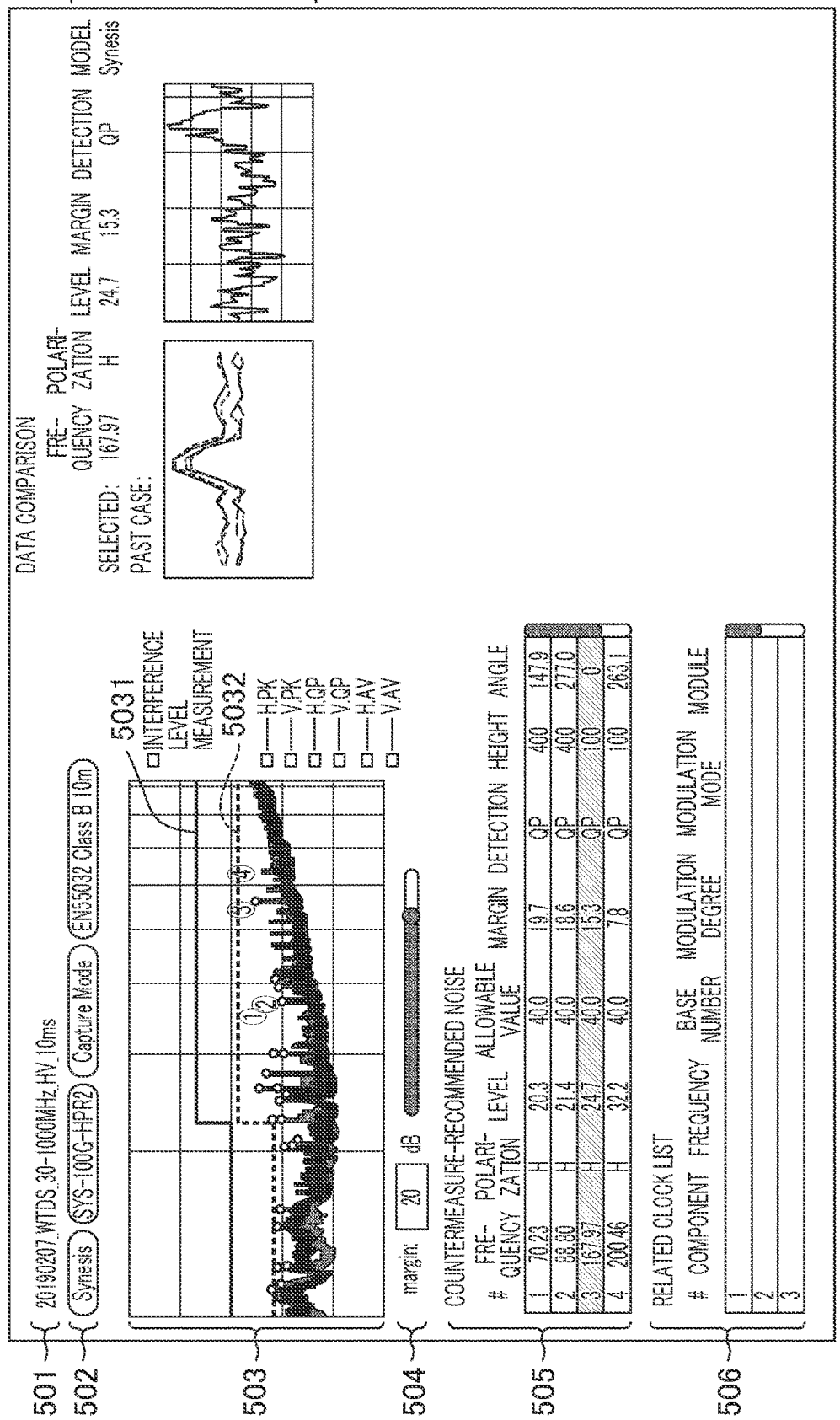
FIG. 13 is an exemplary displayed screen (No. 1).

FIG. 13 is an exemplary screen displayed by the display processing (S55). As understood from the drawing, in this example, displayed information is divided in two vertical columns. The left column displays, sequentially from the top, a file name display region 501 for measurement data, a measurement metadata display region 502, a frequency spectrum display region 503, a margin adjustment operation region 504, a countermeasure-recommended noise display region 505, and a related clock list display region 506. The right column displays a reference data display region 507.

The file name display region 501 indicates the file name of read measurement data. The measurement metadata display region 502 indicates four tags of measurement metadata information related to the measurement data.

The frequency spectrum display region 503 indicates a graph of a frequency spectrum related to the measurement data. In the drawing, a white circle is disposed at the apex of each protruding peak waveform in the frequency spectrum, and an optional peak can be selected by selecting any circle. In the drawing, some peaks denoted by the reference signs of "1" to "4" have corresponding parts in the countermeasure-recommended noise display region 505 to be described later.

Note that a peak waveform means a waveform part having a level relatively higher than a vicinity level in the frequency spectrum, or a sharply protruding waveform part. The term "waveform part" includes not only an apex but also a part having a relatively high level in the vicinity of the apex.

In the graph, an allowable value determined by a standard is illustrated with a solid line 5031, and a set value based on a margin from the allowable value is illustrated with a dashed line 5032. Accordingly, it is possible to instantaneously understand a peak for which a countermeasure is necessary.

The margin adjustment operation region 504 is a region for performing an operation to adjust the margin from the allowable value. A margin amount [dB] and a slide bar for an operation to adjust the margin amount are displayed on the left side in the region. The dashed line 5032 corresponding to the set value can be moved upward and downward by operating the slide bar.

The countermeasure-recommended noise display region 505 displays a list of peak waveform information corresponding to noise for which a countermeasure is recommended. In this exemplary display, information of number, central frequency, polarization, level, allowable value, margin, detection, height, and angle is displayed for each of peak waveforms 1 to 4. The user can determine, based on these pieces of information, noise to which a countermeasure is to be applied. Note that, in the example of the drawing, the third noise having a central frequency of 167.97 [Hz] is selected and highlighted as an example.

The related clock list display region 506 displays nothing in the example of the drawing, but displays a noise cause component candidate in related-component presentation processing to be described later.

The reference data display region 507 displays information for comparison of selected noise with past cases. Peak waveforms having identical or similar central frequency spectra are displayed in a superimposed manner on the left side in the lower part of the region, and the time-domain waveform of the selected noise is displayed on the right side in the lower part of the region. In the example of the drawing, information related to the third noise having a central frequency of 167.97 [Hz] is displayed.

Returning to FIG. 12, when the display processing (S55) is completed, the input processing unit 113 repeats the input detection processing (S56) until either peak is selected (NO at S58).

In this state, when either peak is selected (S59), related-component presentation processing is performed (S59).

Figure 14:
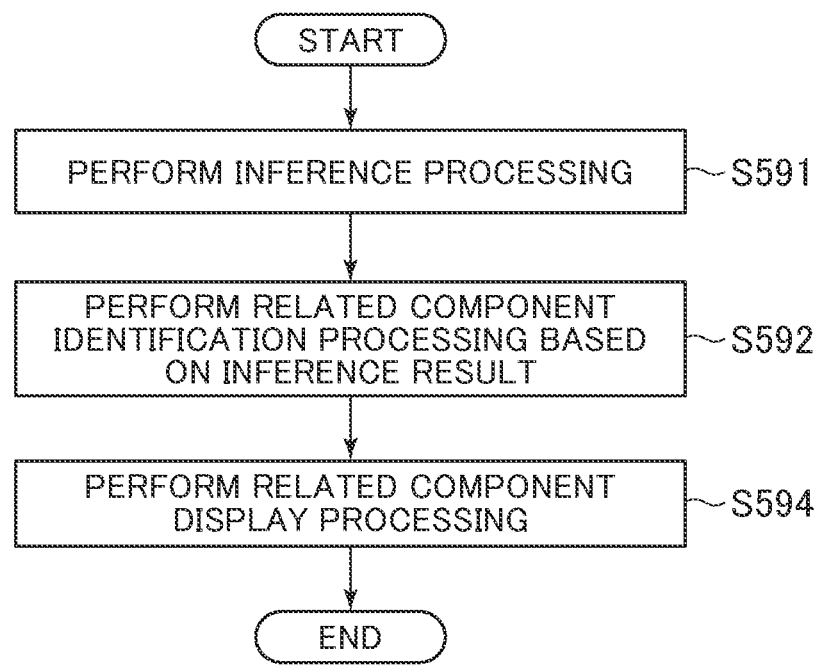
FIG. 14 is a detailed flowchart of related-component presentation processing.

FIG. 14 is a detailed flowchart of the related-component presentation processing. As understood from the drawing, once the processing is started, the inference processing unit 117 performs inference processing of inferring the classification of a selected peak waveform (S591). Specifically, the inference processing unit 117 reads a learned model and inputs, to the learned model, a peak frequency corresponding to the selected peak waveform and level values about the frequency, thereby obtaining the classification of noise at the peak. For example, when an output from the learned model indicates that the noise is the narrow band noise at the probability of 5%, the spread narrow band noise at the probability of 93%, and the wide band noise at the probability of 2%, it is inferred that the noise is the spread narrow band noise.

After the inference processing, the component identification processing unit 118 performs identification processing based on the inference result (S592). Specifically, when the classification is "narrow band noise", the component identification processing unit 118 identifies, as a related component, a component having the closest central frequency among components for which the modulation degree is zero in the component data list. When the classification is "spread narrow band noise", the component identification processing unit 118 identifies, as a related component, a component having a central frequency included in a spread width and having the closest spread width among components for which the modulation degree is larger than zero in the component data list. When the classification is "wide band noise", the component identification processing unit 118 identifies, as a related component, a component having a closer shape of the frequency-spectrum in the wide-band component data list based on the frequency (low), the frequency (high), the central frequency, and the like.

With this configuration, since classification is performed based on a waveform typically generated on the frequency spectrum by noise, it is possible to identify a component acting as a generation cause of noise after roughly classifying the noise, and thus it is possible to more efficiently and accurately identify the component acting as the cause of the noise.

Furthermore, with such a configuration, a classification can be inferred based on data of a unique waveform part as a noise candidate, and thus it is possible to perform efficient noise cause estimation.

After the related component identification processing, the display processing unit 114 performs processing of displaying related components in the related clock list display region 506 in descending order of similarity and displaying a message for a related component having the highest similarity (S594), and then the entire processing ends.

Figure 16:
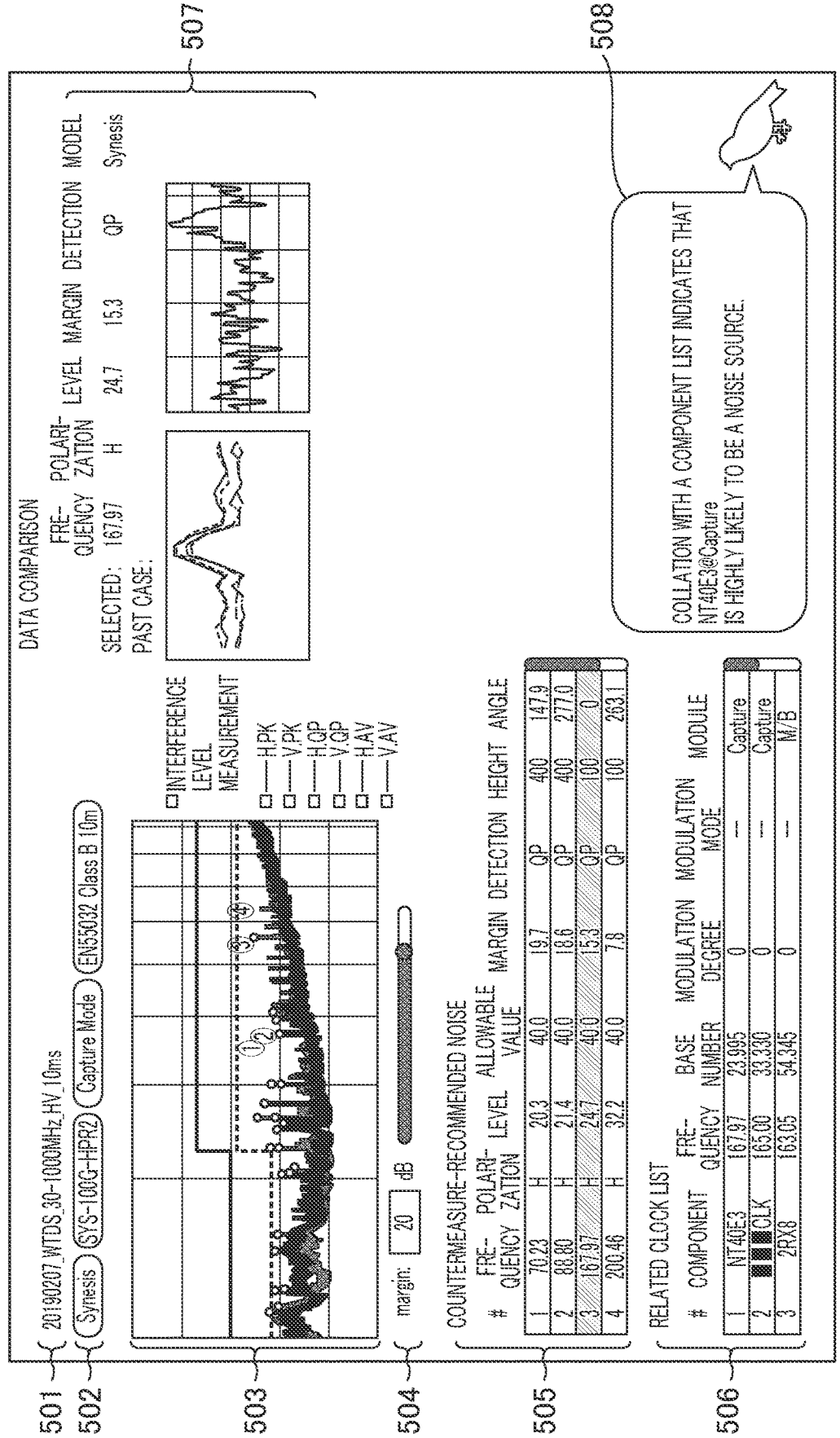
FIG. 16 is an exemplary displayed screen (No. 2).

FIG. 16 is an exemplary displayed screen after the display processing (S594). In the example of the drawing, three related components are displayed sequentially from the top in the related clock list display region 506. In addition, the lower-right part of the screen displays a word balloon message 508 for a related component having the highest similarity, for example, "Collation with a component list indicates that NT40E3@Capture is highly likely to be a noise source.". Note that, in this case, the part "NT40E3@Capture" is selectable.

With this configuration, since noise cause component data is identified and presented from the component data list based on an inferred classification, it is possible to efficiently and accurately identify a causal component of noise. In other words, it is possible to reduce a load of noise cause identification work.

Returning to FIG. 12, after the related-component presentation processing, the input processing unit 113 repeats the input detection processing (S60) again until an instruction for processing of presenting the countermeasure related information of a related component is input (NO at S61).

In this state, when countermeasure related information presentation is commanded through, for example, selection of the part "NT40E3@Capture" in the word balloon message 508 (YES at S61), the countermeasure related information identification processing unit 119 performs countermeasure related information presentation processing (S62). After the countermeasure related information presentation processing, stop of the learning processing (S4) being executed in parallel is commanded (S63), and then the entire processing ends.

Figure 15:
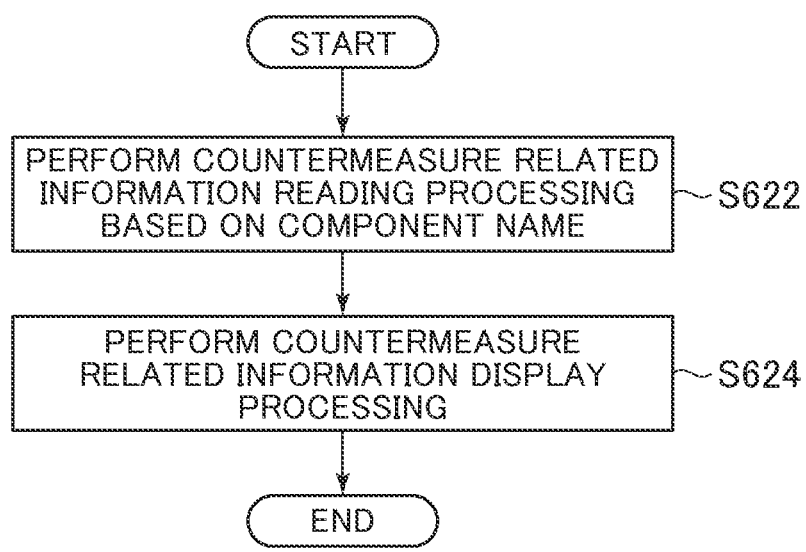
FIG. 15 is a detailed flowchart of countermeasure related information presentation processing.

FIG. 15 is a detailed flowchart of the countermeasure related information presentation processing. As understood from the drawing, once the processing is started, processing of reading countermeasure related information based on a component identified as a related component is performed (S622). More specifically, the component name of the component identified as a related component is used as a keyword to search a countermeasure knowledge base, a past countermeasure report database, and the like and read related countermeasure information.

For example, when the name of the related component is "ABC", the countermeasure information as illustrated in FIG. 5, in other words, countermeasure information in a section "noise generated from component ABC" of a book "noise countermeasure guide (first edition)" and countermeasure information "Component ABC was used. Degraded from the default value by 7 dB approximately. Countermeasure is bonding to the back of component ABC with a copper foil tape." in related description in a past countermeasure report are read as countermeasure related information by the search. Note that countermeasure information includes information associable with a countermeasure, for example, information related to a phenomenon or the like related to noise.

After the reading processing, the display processing unit 114 performs processing of displaying the countermeasure related information (S624), and then the entire processing ends.

Note that although the database search is performed based on the component name of a related component in the present embodiment, the present disclosure is not limited to such a configuration. Thus, the database search may be performed based on any other information related to a related component.

With this configuration, it is possible to identify a causal component of noise as well as to check the countermeasure related information thereof.

Furthermore, with such a configuration, it is possible to perform examinations on a noise cause upon multiple perspectives based on book information, past countermeasure report information, and the like.

2. Second Embodiment (2.1 Hardware Configuration)

The hardware configuration of an analysis device 1' according to the present embodiment is substantially same as the configuration (FIGS. 1 to 6) described in the first embodiment, and thus detailed description thereof is omitted. However, the analysis device 1' according to the present embodiment has a configuration with an additional function for analysis in addition to the configuration of the analysis device 1 according to the first embodiment.

Figure 17:
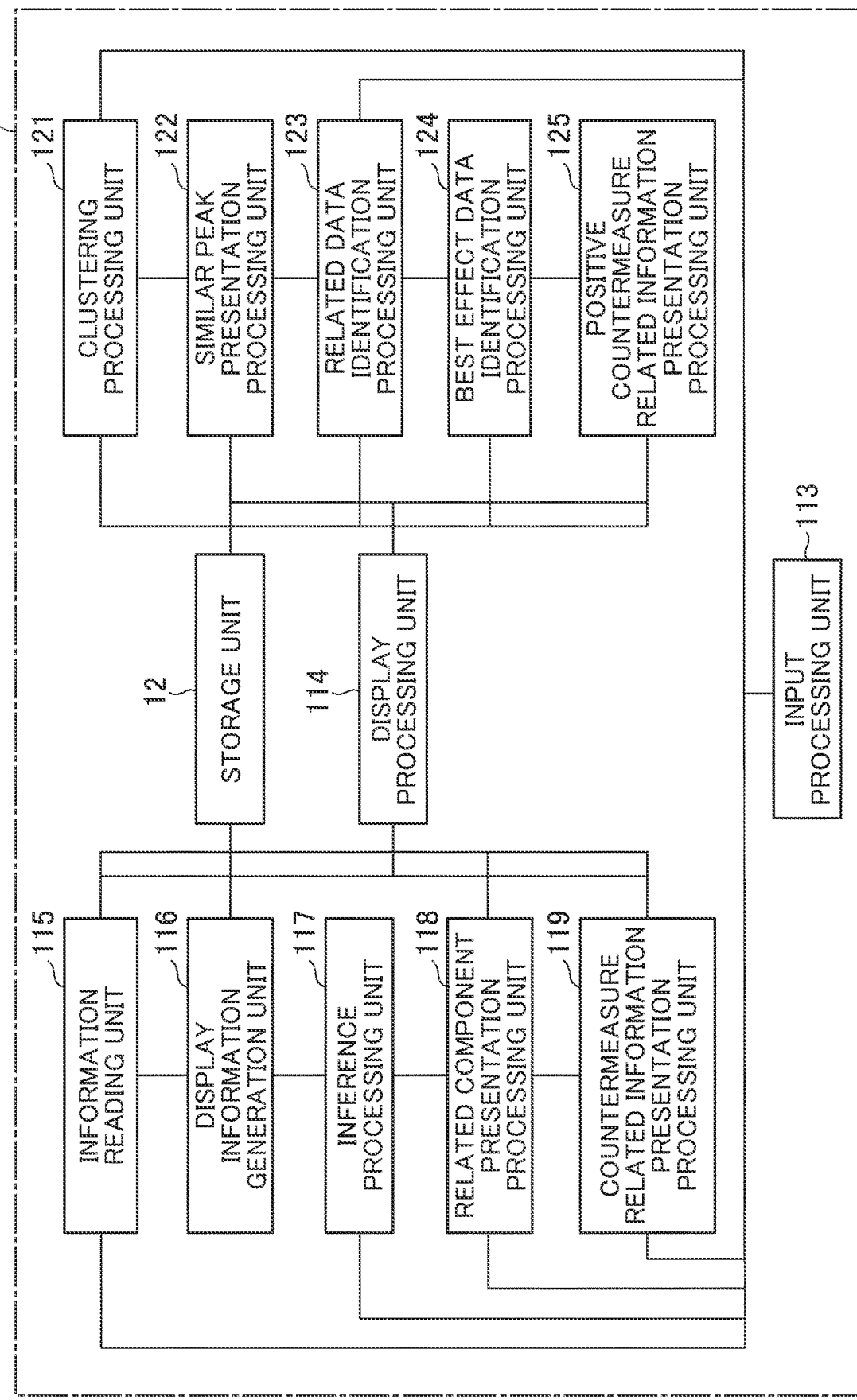
FIG. 17 is a functional block diagram of an analysis device according to the second embodiment.

FIG. 17 is a functional block diagram of the analysis device 1' when performing the analysis processing (S5) according to the present embodiment. Note that any function substantially same as that of the configuration according to the first embodiment is denoted by the same reference sign.

As understood from the drawing, the analysis device 1' according to the present embodiment further includes a clustering processing unit 121, a similar peak presentation processing unit 122, a related data identification processing unit 123, a best effect data identification processing unit 124, and a positive countermeasure related information presentation processing unit 125.

In accordance with a command from the input processing unit 113, the clustering processing unit 121 performs clustering processing on a selected peak and outputs a similar peak. The output similar peak is presented to a user through the display unit 13 by the similar peak presentation processing unit 122.

The related data identification processing unit 123 identifies related data based on information related to the similar peak. The best effect data identification processing unit 124 performs processing of identifying measurement data for which an indicator related to a noise reduction effect is favorable among the related data. The positive countermeasure related information presentation processing unit 125 performs processing of searching a database based on the measurement data for which an indicator related to a noise reduction effect is favorable, and generating and presenting positive countermeasure related information.

(2.2 Operation)

In the present embodiment as well, similarly to the first embodiment, modes for performing the learning processing (S4) and the analysis processing (S5) are provided. Their operation is substantially same as that in the first embodiment, and thus detailed description thereof will be omitted (refer to FIG. 9, etc., for example).

(Learning Processing)

The operation of the learning processing (S4) is same as that in the first embodiment, and thus detailed description thereof is omitted.

(Measurement Data Analysis Processing)

Figure 18:
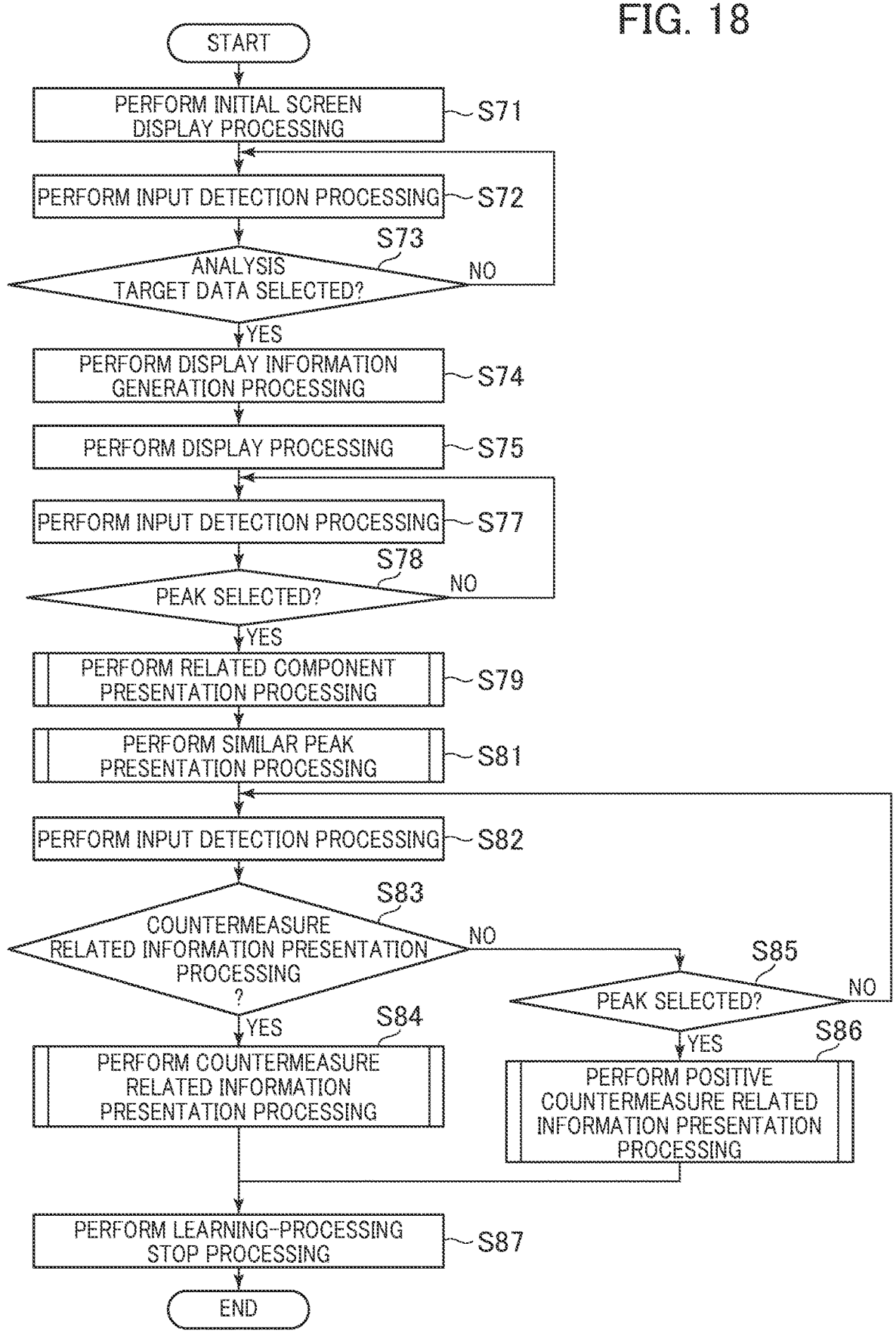
FIG. 18 is a detailed flowchart of analysis processing according to the second embodiment.

FIG. 18 is a detailed flowchart of the analysis processing (S5) according to the present embodiment. As understood from the drawing, in the present embodiment as well, similarly to the first embodiment, the related-component presentation processing and the countermeasure related information presentation processing are performed (S71 to S79 and S82 to S84). Note that the contents of each processing are substantially same as those according to the first embodiment, and thus detailed description thereof is omitted.

In the present embodiment, the analysis device 1' additionally performs similar peak presentation processing (S81) and positive countermeasure related information presentation processing (S86) based thereon.

When one peak waveform is selected on the frequency spectrum (YES at S78) after predetermined display processing (S75) is performed, the related-component presentation processing (S79) is performed, and thereafter, the similar peak presentation processing (S81) is performed.

Figure 19:
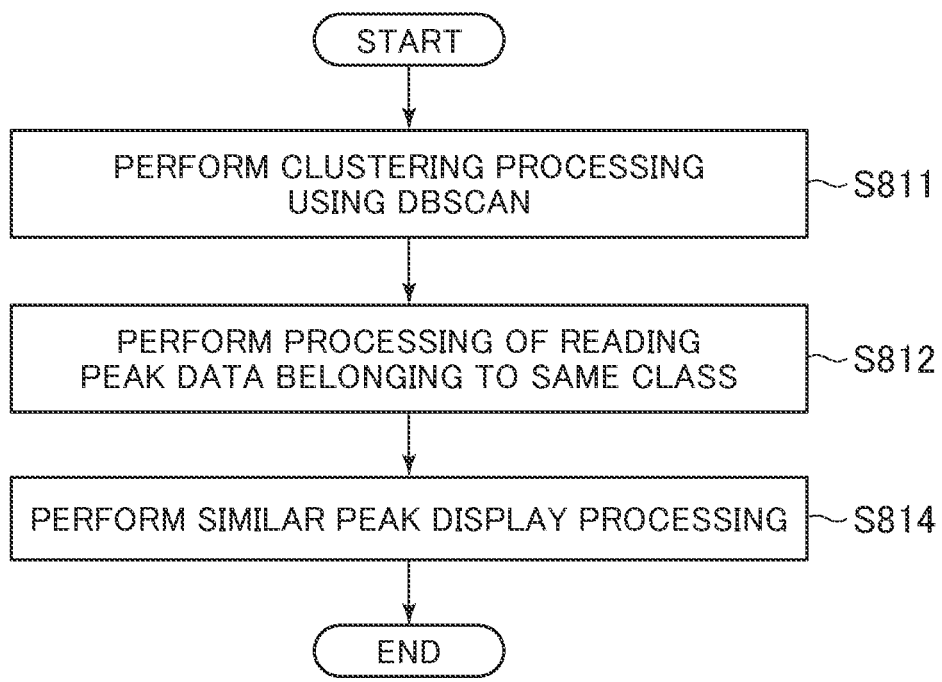
FIG. 19 is a detailed flowchart of similar peak presentation processing.

FIG. 19 is a detailed flowchart of the similar peak presentation processing. As understood from the drawing, once the processing is started, the clustering processing unit 121 reads peak data (the central frequency of a peak on the frequency spectrum and a level value in the frequency domain of a predetermined width including the central frequency) related to a large number of pieces of measurement data stored in the storage unit 12, performs clustering processing on the measurement data together with peak data related to measurement data referred as an analysis target, and identifies, as similar peaks, peak waveforms belonging to the same class (S811).

In the present embodiment, DBSCAN (Density-Based Spatial Clustering of Applications with Noise) is used for the clustering processing. With the DBSCAN, it is possible to classify data without explicitly specifying the number of clusters.

Note that although the DBSCAN is used as the method of the clustering processing in the present embodiment, the present disclosure is not limited to such a configuration. Thus, various kinds of well-known clustering methods may be applied.

Furthermore, although the clustering processing is performed based on a frequency-domain characteristic amount of a peak waveform in the present embodiment, the present disclosure is not limited to such a configuration. Thus, the clustering processing may be performed by using another characteristic amount such as a time-domain characteristic amount.

When peak data belonging to the same class is identified, the similar peak presentation processing unit 122 performs processing of reading the peak data (S812). Thereafter, the read similar peaks are subjected to display processing by the display processing unit 114 (S814).

Figure 20:
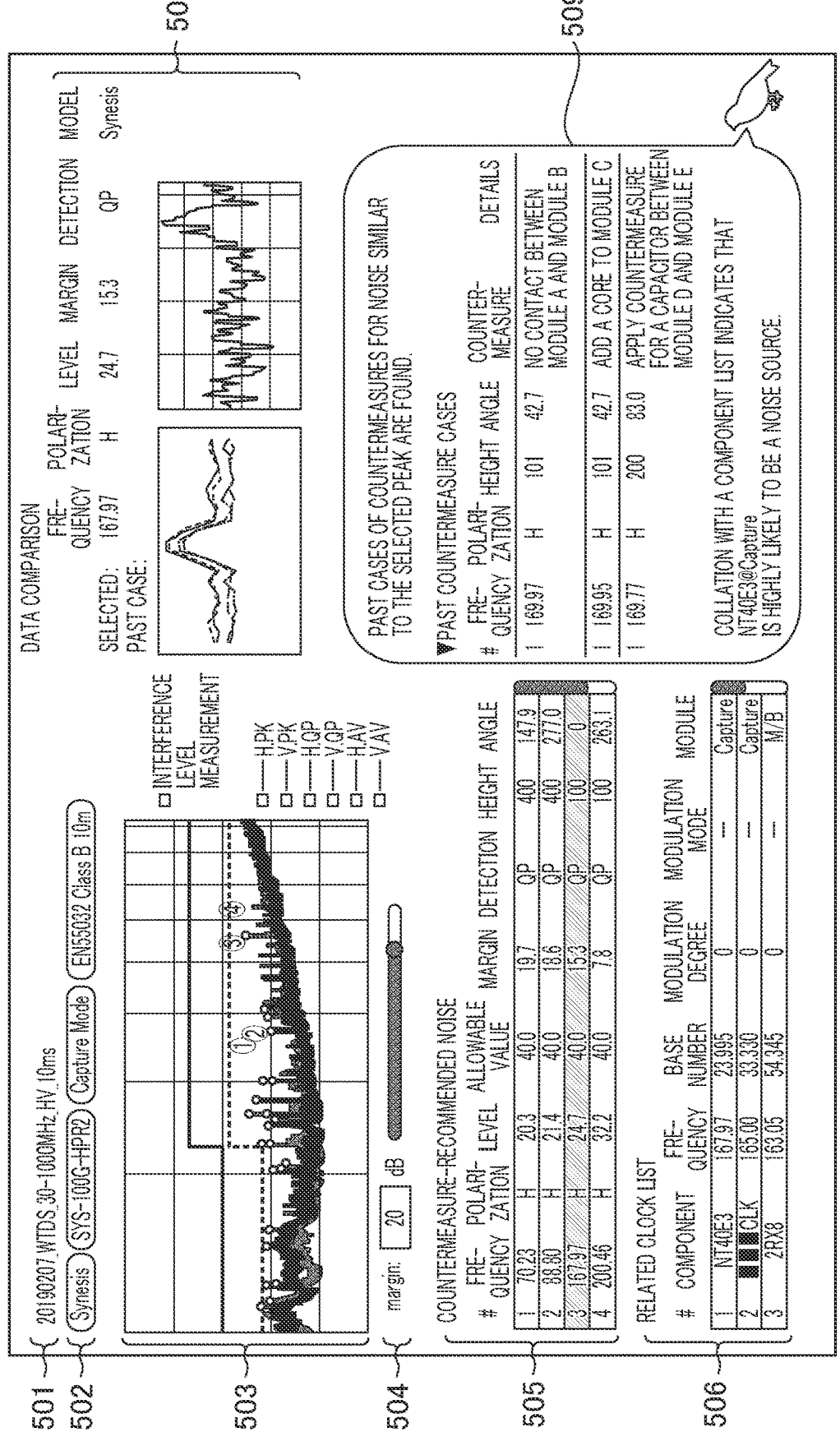
FIG. 20 is an exemplary displayed screen (No. 3).

FIG. 20 is an exemplary displayed screen after the similar peak display processing (S814). As understood from the drawing, a word balloon message 509 is displayed in the lower-right part of the drawing. In addition to information related to a related component having the highest similarity, information related to three similar peaks is displayed together with the message "past cases of countermeasures for noise similar to the selected peak are found." in the word balloon. Note that the similar peaks are each selectable.

With this configuration, it is possible to refer to measurement data of similar noise, and thus it is possible to efficiently and accurately perform noise cause estimation. Furthermore, it is possible to perform noise cause estimation upon more multiple perspectives through check together with causal component data.

Returning to FIG. 18, after the similar peak presentation processing (S81), the processing becomes an input waiting state as described above (S81). In this state, when one of the similar peaks is selected (No at S83 and YES at S85), the positive countermeasure related information presentation processing (S86) is executed. After the countermeasure related information presentation processing (S84) or the positive countermeasure related information presentation processing, stop of the learning processing (S4) being executed in parallel is commanded (S63), and then the entire processing ends.

Figure 21:
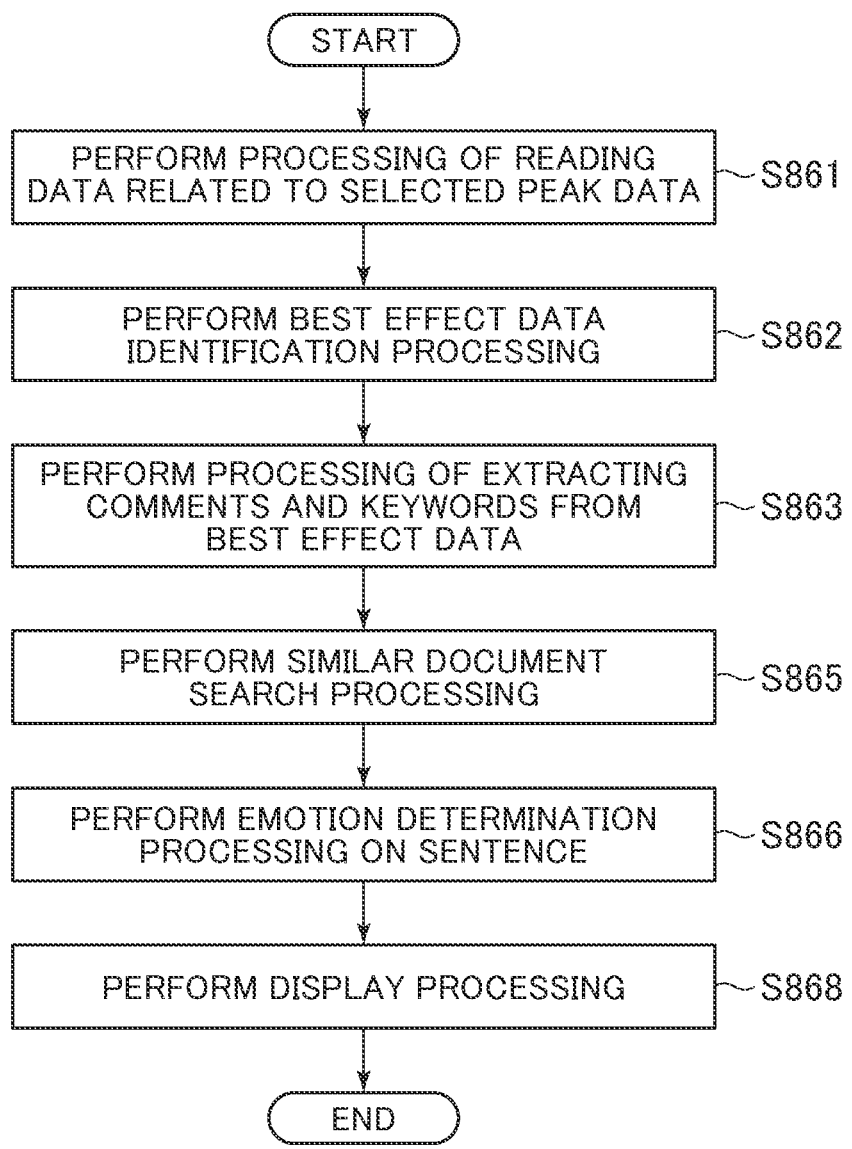
FIG. 21 is a detailed flowchart of positive countermeasure related information presentation processing.

FIG. 21 is a detailed flowchart of the positive countermeasure related information presentation processing. As understood from the drawing, once the processing is started, the related data identification processing unit 123 performs processing of reading data related to the peak selected among the similar peaks (S861). In the present embodiment, the related data is a plurality of pieces of data having measurement start dates and times before and after the measurement start date and time of measurement data related to the selected peak. After read by the related data identification processing unit 123, these pieces of related data are sorted in chronological order and provided for display to be described later.

Note that the related data identification in the above-described processing is performed by using the measurement start date but may be performed based on another condition. For example, the related data may be determined based on such a criterion that the related data is only data that additionally satisfies conditions such as a frequency difference equal to or smaller than a predetermined amount, the same polarization, and a bandwidth difference equal to or smaller than a predetermined value.

When the related data is identified, the best effect data identification processing unit 124 performs processing of identifying best effect data from among the related data. The best effect data is measurement data for which an indicator related to a noise reduction effect is favorable, and for example, in the present embodiment, the best effect data is measurement data for which the level QP as the indicator is smallest.

With this configuration, it is possible to accurately identify measurement data for which an indicator related to a noise reduction effect is favorable among simultaneously obtained measurement data.

Note that the level QP is used as the indicator in the present embodiment but may be any other value related to measurement data.

When the best effect data is identified, the positive countermeasure related information presentation processing unit 125 extracts a comment from "remarks such as noise countermeasures" associated with the best effect data (S863). For example, the comment is "prevent noise at the opening part of component ABC with a shield".

Furthermore, processing of extracting a keyword from the comment is performed (S863). Various kinds of well-known natural language processing such as morpheme analysis and TF-IDF may be applied in this keyword extraction processing. Through the keyword extraction processing, for example, the keywords "shield", "component ABC", and "noise at the opening part" are extracted from the comment "Prevent noise at the opening part of component ABC with a shield".

When the keyword extraction processing is completed, the positive countermeasure related information presentation processing unit 125 performs processing of searching from a countermeasure knowledge base and a countermeasure report database for a similar sentence based on the extracted keywords (S865). In the present embodiment, after sentences including the keywords or words similar to the keywords are searched, any sentence having a similarity equal to or larger than a threshold value is extracted. Various kinds of well-known natural language processing are used in this search processing. For example, BERT (Bidirectional Encoder Representations from Transformers) are applicable as the natural language processing.

After the similar sentence search processing, the positive countermeasure related information presentation processing unit 125 performs emotion determination processing (content determination processing) of determining whether each sentence has positive or negative contents from a viewpoint of noise countermeasure (S866). Various kinds of well-known natural language processing methods, particularly, a sentiment analysis method may be applied to the emotion determination processing. Accordingly, for example, it is determined that the sentence "a shield was used for component ABC but no expected effect was obtained" has negative contents, and it is determined that the sentence "improved from the default value by 7 dB by using component ABC" has positive contents.

Thereafter, the positive countermeasure related information presentation processing unit 125 performs processing of displaying sentences having positive contents and various kinds of related information (S868). Thereafter, the entire processing ends.

Figure 22:
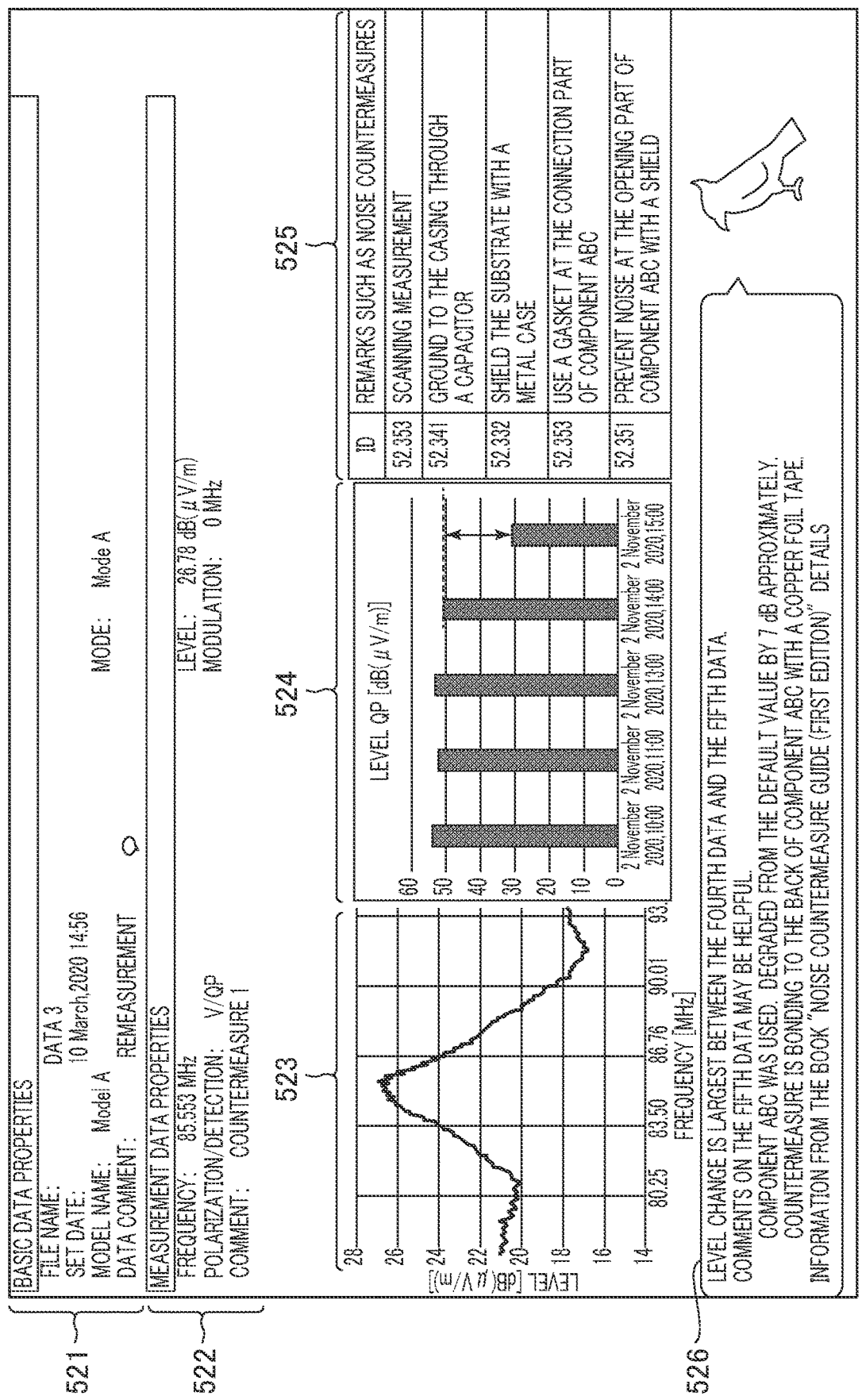
FIG. 22 is an exemplary displayed screen (No. 4).

FIG. 22 is an exemplary displayed screen after the display processing (S868). As understood from the drawing, a measurement basic information display region 521 in which basic information related to measurement is displayed is disposed in the uppermost part of the drawing. In addition, a measurement data display region 522 in which information related to measurement data is displayed is disposed directly below the measurement basic information display region. The information related to measurement data includes the central frequency of noise, a corresponding level, polarization and detection states, the existence and degree of modulation, and a comment.

Three display regions are horizontally arranged directly below the measurement data display region. An enlarged view display region 523 in which an enlarged view of a selected similar peak is displayed is displayed on the left region among the three display regions. In addition, a related data display region 524 in which pieces of related data sorted in chronological order are displayed is displayed in the central region. Furthermore, a comment display region 525 in which information of "remarks such as noise countermeasures" related to the related data is displayed is displayed in the right region. It is understood from the related data display region 524 that the value of the level QP of the rightmost measurement data in the region is small and a noise reduction effect is high in the measurement data.

A positive countermeasure related information presentation region 526 in which positive countermeasure related information is presented is disposed in the lowermost part of the drawing. The region includes a hint for the best effect data, information of "remarks such as noise countermeasures" related to the best effect data, and information related to the positive countermeasure related information.

In the example of the drawing, the sentence "Level change is largest between the fourth data and the fifth data." is displayed as information of a hint for the best effect data. In addition, the sentence "Component ABC was used. Degraded from the default value by 7 dB approximately. Countermeasure is bonding to the back of component ABC with a copper foil tape." is displayed as the information of "remarks such as noise countermeasures" related to the best effect data. Furthermore, the sentence "Information from the book "noise countermeasure guide (first edition)"" is displayed as the information related to the positive countermeasure related information. Moreover, a "details" button for transition to details is displayed on the right side of this sentence. When the details button is selected, the positive countermeasure related information is further displayed.

With this configuration, it is possible to check simultaneously obtained measurement data and accurately examine measurement data for which an indicator related to a noise reduction effect is favorable among the measurement data obtained in the same time period.

Furthermore, with such a configuration, it is possible to further acquire related information from countermeasure related information included in measurement data for which an indicator related to a noise reduction effect is favorable, and thus it is possible to examine effective countermeasures.

3. Modifications

In the second embodiment, keywords are extracted from a comment associated with best effect data and database search is performed, however the present disclosure is not limited to such a configuration. Thus, for example, countermeasure database search may be performed additionally with information related to a related component (for example, the component name), and countermeasure information and the like may be presented. With such a configuration, it is possible to more accurately obtain countermeasure information.

It is described in the second embodiment that various kinds of natural language processing are performed, however the natural language processing may be executed by an external server. With such a configuration, it is possible to reduce a processing load on the analysis device.

It is described in the above-described embodiments that noise analysis is performed based on a peak waveform on the frequency spectrum, however the present disclosure is not limited to such a configuration. Thus, for example, noise analysis may be performed based on another unique waveform part.

The embodiments of the present disclosure are described above but indicated as only some exemplary applications of the present disclosure, and it is not intended to limit the technical scope of the present disclosure to specific configurations of the above-described embodiments. Furthermore, the above-described embodiments may be combined as appropriate without causing inconsistency.

INDUSTRIAL APPLICABILITY

The present disclosure is applicable to at least the industrial field of manufacturing a device or the like configured to support countermeasures for noise (interfering waves) from electronic devices and the like.

REFERENCE SIGNS LIST 1 analysis device
11 control unit
12 storage unit
13 display unit
14 audio output unit
16 input unit
17 I/O unit
18 communication unit
2 client device
3 server device
100 analysis system

The invention claimed is:
1. An analysis system comprising:
inference processor circuitry configured to infer a corresponding classification by inputting part of frequency spectrum data corresponding to reference measurement data to a learned model having learned a relation between part of frequency spectrum data corresponding to sample measurement data and a classification related to noise corresponding to the part;
causal component identification processor circuitry configured to identify causal component data of noise from a component data list based on the inferred classification; and
a presentation information generator configured to generate presentation information for a user based on the causal component data, and
wherein the classification is a classification based on a typical waveform generated on a frequency spectrum by noise,
wherein the typical waveform comprises a narrow band waveform having a peak at one frequency, a spread narrow band waveform maintaining a relatively high level in a predetermined frequency range and having a peak near each of start and end points of the frequency range, and a wide band waveform corresponding to neither the narrow band waveform nor the spread narrow band waveform and maintainin a relatively high level in a predetermined frequency range,
wherein the component data list comprises a reference data list for the narrow band waveform referenced when the inferred classification indicates the narrow band waveform, a reference data list for the spread narrow band waveform referenced when the inferred classification indicates the spread narrow band waveform, and a reference data list for the wide band waveform referenced when the inferred classification indicates the wide band waveform, and
wherein the causal component identification processor circuitry is further configured to reference one of the reference data list for the narrow band waveform, the reference data list for the spread narrow band waveform and the reference data list for the wide band waveform based on the inferred classification, and identify the causal component data based on the reference measurement data.

2. The analysis system according to claim 1, wherein the part of frequency spectrum data is a unique waveform part included in frequency spectrum data.

3. The analysis system according to claim 2, wherein the unique waveform part is a peak waveform part included in frequency spectrum data.

4. The analysis system according to claim 1, wherein the spread narrow band waveform is generated due to a spread spectrum clock generator.

5. The analysis system according to claim 1, wherein the causal component data comprises countermeasure related information for corresponding noise.

6. The analysis system according to claim 5, further comprising first database reference processor circuitry configured to acquire related information by referring to, based on a keyword included in the countermeasure related information, a countermeasure database including information related to noise countermeasures.

7. The analysis system according to claim 6, wherein the countermeasure database comprises book information and countermeasure report information.

8. An analysis system comprising:
inference processor circuitry configured to infer a corresounding classification by inputting part of frequency spectrum data corresponding to reference measurement data to a learned model having learned a relation between part of frequency spectrum data corresponding to sample measurement data and a classification related to noise corresponding to the part;
causal component identification processor circuitry configured to identify causal component data of noise from a component data list based on the inferred classification;
a presentation information generator configured to generate presentation information for a user based on the causal component data; and
clustering processor circuitry configured to identify similar measurement data including frequency spectrum data similar to the part of frequency spectrum data corresponding to the reference measurement data by performing clustering processing on the part of frequency spectrum data corresponding to the reference measurement data together with all or part of the sample measurement data.

9. The analysis system according to claim 8, wherein the clustering processing is performed by using DBSCAN.

10. The analysis system according to claim 8 further comprising:
related measurement data identification processor circuitry configured to identify, based on the similar measurement data, related measurement data as measurement data that is related to the similar measurement data; and
effect determination processor circuitry configured to identify measurement data for which an indicator related to a noise reduction effect is favorable among the related measurement data.

11. The analysis system according to claim 10, wherein the related measurement data is measurement data that is measured in the same time period with the similar measurement data.

12. The analysis system according to claim 10, wherein the measurement data for which an indicator related to a noise reduction effect is favorable comprises countermeasure related information for corresponding noise, the analysis system further comprises second database reference processor circuitry configured to acquire related information by referring to a countermeasure database including information related to past noise countermeasures based on a keyword included in the countermeasure related information corresponding to the measurement data for which the indicator is favorable.

13. The analysis system according to claim 12, wherein the countermeasure database comprises book information and countermeasure report information.

14. The analysis system according to claim 12, further comprising content determination processor circuitry configured to determine whether the related information is positive information or negative information,
wherein the presentation information generator generates presentation information for a user related to positive information among the related information based on a result of the determination by the content determination processor circuitry.

15. An analysis method comprising:
inferring a corresponding classification by inputting part of frequency spectrum data corresponding to reference measurement data to a learned model having learned a relation between part of frequency spectrum data corresponding to sample measurement data and a classification related to noise corresponding to the part;
identifying causal component data of noise from a component data list based on the inferred classification; and
generating presentation information for a user based on the causal component data, and
wherein the classification is a classification based on a typical waveform generated on a frequency spectrum by noise,
wherein the typical waveform comprises a narrow band waveform having a peak at one frequency, a spread narrow band waveform maintaining a relatively high level in a predetermined frequency range and having a peak near each of start and end points of the frequency range, and a wide band waveform corresponding to neither the narrow band waveform nor the spread narrow band waveform and maintaining a relatively high level in a predetermined frequency range,
wherein the component data list comprises a reference data list for the narrow band waveform referenced when the inferred classification indicates the narrow band waveform, a reference data list for the spread narrow band waveform referenced when the inferred classification indicates the spread narrow band waveform, and a reference data list for the wide band waveform referenced when the inferred classification indicates the wide band waveform, and
wherein identifying causal component data further comprises referencing one of the reference data list for the narrow band waveform, the reference data list for the spread narrow band waveform and the reference data list for the wide band waveform based on the inferred classification, and identifying the causal component data based on the reference measurement data.

16. A non-transitory computer-readable medium having one or more executable instructions stored thereon, which, when executed by processor circuitry, cause the processor circuitry to perform an analysis method, the method comprising:
inferring a corresponding classification by inputting part of frequency spectrum data corresponding to reference measurement data to a learned model having learned a relation between part of frequency spectrum data corresponding to sample measurement data and a classification related to noise corresponding to the part;
identifying causal component data of noise from a component data list based on the inferred classification; and
generating presentation information for a user based on the causal component data,
wherein the classification is a classification based on a typical waveform generated on a frequency spectrum by noise,
wherein the typical waveform comprises a narrow band waveform having a peak at one frequency, a spread narrow band waveform maintaining a relatively high level in a predetermined frequency range and having a peak near each of start and end points of the frequency range, and a wide band waveform corresponding to neither the narrow band waveform nor the spread narrow band waveform and maintainin a relatively high level in a predetermined frequency range,
wherein the component data list comprises a reference data list for the narrow band waveform referenced when the inferred classification indicates the narrow band waveform, a reference data list for the spread narrow band waveform referenced when the inferred classification indicates the spread narrow band waveform, and a reference data list for the wide band waveform referenced when the inferred classification indicates the wide band waveform, and
wherein identifying causal component data further comprises referencing one of the reference data list for the narrow band waveform, the reference data list for the spread narrow band waveform and the reference data list for the wide band waveform based on the inferred classification, and identifying the causal component data based on the reference measurement data.

* * * * *